(12) United States Patent
Yeh et al.

(10) Patent No.: US 12,327,781 B2
(45) Date of Patent: Jun. 10, 2025

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Ting-Yu Yeh, Hsinchu (TW); Ching-He Chen, Taoyuan (TW); Kuo-Chiang Ting, Hsinchu (TW); Weiming Chris Chen, Taipei (TW); Chia-Hao Hsu, Hsinchu (TW); Kuan-Yu Huang, Taipei (TW); Shu-Chia Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 532 days.

(21) Appl. No.: 17/401,265

(22) Filed: Aug. 12, 2021

(65) Prior Publication Data
US 2023/0050785 A1    Feb. 16, 2023

(51) Int. Cl.
| | |
|---|---|
| *H01L 23/48* | (2006.01) |
| *H01L 21/00* | (2006.01) |
| *H01L 21/48* | (2006.01) |
| *H01L 23/498* | (2006.01) |
| *H01L 25/065* | (2023.01) |

(52) U.S. Cl.
CPC .... *H01L 23/49816* (2013.01); *H01L 21/4853* (2013.01); *H01L 21/4857* (2013.01); *H01L 21/486* (2013.01); *H01L 23/49822* (2013.01); *H01L 23/49833* (2013.01); *H01L 23/49838* (2013.01); *H01L 25/0655* (2013.01)

(58) Field of Classification Search
CPC ........... H01L 23/49816; H01L 21/4853; H01L 24/81; H01L 23/562; H01L 2924/15311; H01L 2924/3511
See application file for complete search history.

(56) References Cited

U.S. PATENT DOCUMENTS

| | | | | |
|---|---|---|---|---|
| 5,641,946 | A * | 6/1997 | Shim | H05K 3/3457 361/767 |
| 6,296,169 | B1 * | 10/2001 | Ong | B23K 1/203 228/36 |
| 8,471,154 | B1 * | 6/2013 | Yoshida | H01L 23/3128 174/262 |
| 8,993,380 | B2 | 3/2015 | Hou et al. | |
| 9,281,254 | B2 | 3/2016 | Yu et al. | |
| 9,299,649 | B2 | 3/2016 | Chiu et al. | |
| 9,372,206 | B2 | 6/2016 | Wu et al. | |

(Continued)

*Primary Examiner* — Nicholas J Tobergte
(74) *Attorney, Agent, or Firm* — JCIPRNET

(57) ABSTRACT

A semiconductor structure and a manufacturing method thereof are provided. The method includes the following steps. A plurality of conductive balls is placed over a circuit substrate, where each of the conductive balls is placed over a contact area of one of a plurality of contact pads that is accessibly revealed by a patterned mask layer. The conductive balls are reflowed to form a plurality of external terminals with varying heights connected to the contact pads of the circuit substrate, where a first external terminal of the external terminals formed in a first region of the circuit substrate and a second external terminal of the external terminals formed in a second region of the circuit substrate are non-coplanar.

20 Claims, 19 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2003/0129822 A1* | 7/2003 | Lee ............... H01L 25/0657 |
| | | 257/E21.705 |
| 2011/0233771 A1* | 9/2011 | Kwon .............. H01L 22/20 |
| | | 257/737 |
| 2019/0139847 A1* | 5/2019 | Wang .............. H01L 23/3135 |
| 2020/0058611 A1* | 2/2020 | Lin ................. H01L 24/17 |
| 2020/0395308 A1* | 12/2020 | Wu ................. H01L 21/4853 |

* cited by examiner

SEMICONDUCTOR STRUCTURE AND MANUFACTURING METHOD THEREOF

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages. Thus, new packaging technologies have begun to be developed. For example, some packages rely on bumps of solder to provide an electrical connection, and the different layers making up the interconnection in the packages have different coefficients of thermal expansion (CTEs). As a result, a relatively large stress derived from this difference is exhibited on the joint area, which causes the risk of delamination and/or cold joint. These relatively new types of packaging technologies for semiconductor packages face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
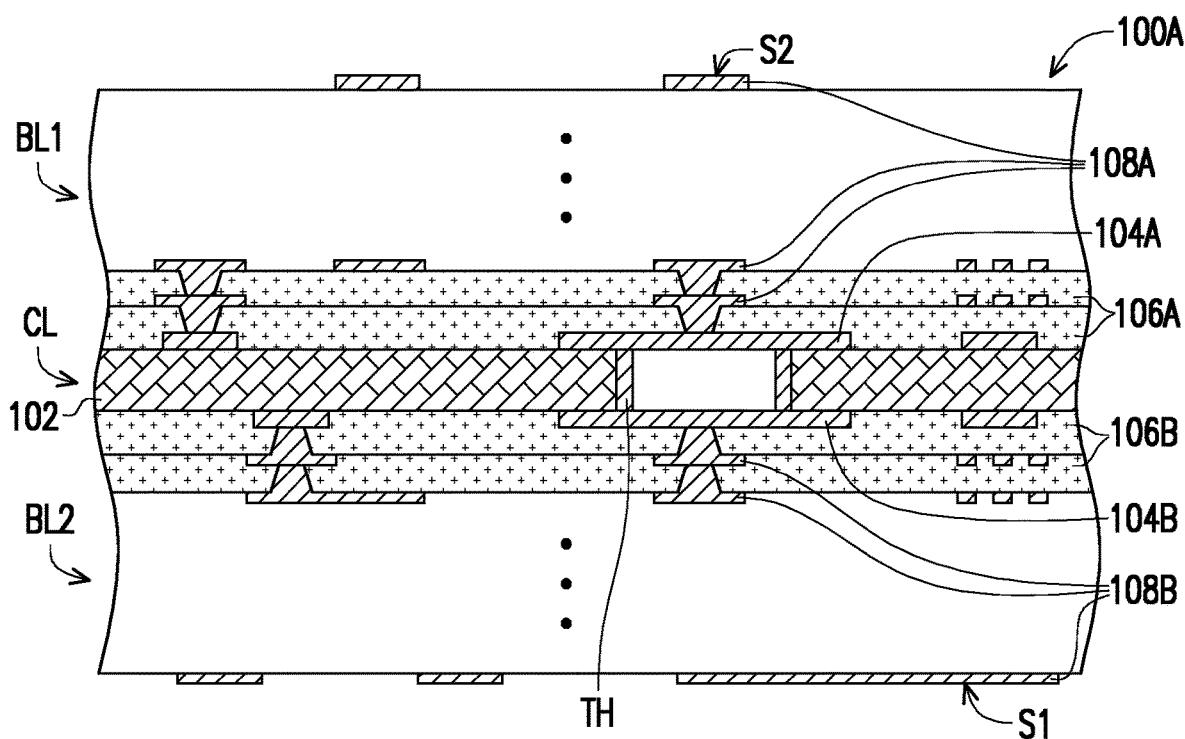
FIG. 1 is a cross-sectional view of a portion of a circuit substrate in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a cross-sectional view of a portion of a circuit substrate in accordance with some embodiments. Referring to FIG. 1, a circuit substrate 100A is provided. In some embodiments, the circuit substrate 100A includes a core layer CL and build-up layers (BL1, BL2) disposed on two opposing sides of the core layer CL. In some embodiments, the circuit substrate 100A is referred to as a package substrate. For example, the core layer CL includes a core dielectric layer 102, core conductive layers (104A, 104B), and plated through holes TH. It should be noted that the illustration of the circuit substrate is merely an example, the circuit substrate may be provided as a coreless substrate (e.g., the core layer is omitted) in accordance with other embodiments.

The core dielectric layer 102 may include prepreg, Ajinomoto Buildup Film (ABF), resin coated copper foil (RCC), polyimide, photo-image dielectric (PID), ceramic core, glass core, molding compound, a combination thereof, or other suitable dielectric material(s). The core conductive layers (104A, 104B) may be formed respectively on the opposite sides of the core dielectric layer 102. For example, materials of the core conductive layers (104A, 104B) include copper, gold, tungsten, aluminum, silver, gold, a combination thereof, or the like. The plated through holes TH may be disposed in and penetrate through the core dielectric layer 102 to provide electrical connections between the core conductive layers (104A, 104B). The plated through holes TH may be filled with one or more conductive materials. Alternatively, the plated through holes TH may be lined with a conductive material and filled up with an insulating material (not shown).

Continue to FIG. 1, the build-up layers (BL1, BL2) may be respectively formed over the core conductive layers (104A, 104B) of the core layer CL. In some embodiment, each of the build-up layers (BL1, BL2) includes dielectric layers (e.g., 106A and 106B) and conductive patterns (e.g., 108A and 108B) alternately stacked over the core layer CL. Although a few layers of conductive patterns and dielectric layers are illustrated for each build-up layer, it is understood that the number of dielectric layers and the number of the conductive patterns may be adjusted depending on the circuit requirements.

In some embodiments, the dielectric layers (106A, 106B) are made of build-up material(s). For example, the dielectric layers (106A, 106B) include prepreg, polyimide, polybenzoxazole (PBO), benzocyclobutene (BCB), a nitride (e.g., silicon nitride), an oxide such as silicon oxide, phosphosilicate glass (PSG), borosilicate glass (BSG), boron-doped phosphosilicate glass (BPSG), a combination thereof, and/or the like. The conductive patterns (108A, 108B) may include conductive materials (e.g., aluminum, titanium, copper, nickel, tungsten, and/or alloys thereof). In some embodiments, the conductive patterns (108A, 108B) are electrically connected to the plated through holes TH through the core conductive layers (104A, 104B). The conductive patterns (108A, 108B) at each level may include lines, pads, vias, etc. In some embodiments, the conductive patterns (108A, 108B) include stacked vias disposed on two opposing sides of the plated through holes TH. Although a staggered-via configuration may be possible.

Still referring to FIG. 1, the conductive patterns (108A, 108B) over two opposing sides of the core layer CL may be substantially symmetrical. In some embodiments, the outermost levels of the conductive patterns (108A, 108B) have different pattern densities for further electrical connection. For example, the outermost level of the conductive pattern 108B located at the first side S1 of the circuit substrate 100A has sparser pattern density for external terminals formed thereon, and the outermost level of the conductive pattern 108A located at the second side S2 of the circuit substrate 100A has denser pattern density for package component(s) mounting thereon. In some embodiments, the outermost level of the conductive pattern 108A includes conductive pads for coupling semiconductor components (e.g., interposers, dies, passive devices, etc.). In some embodiments, the outermost level of the conductive pattern 108B includes conductive pads in different sizes, where the external terminals may be mounted on the larger pads and passive device(s) may be mounted on the smaller pads. The details of mounting the external terminals will be described later in other embodiments.

Figure 2:
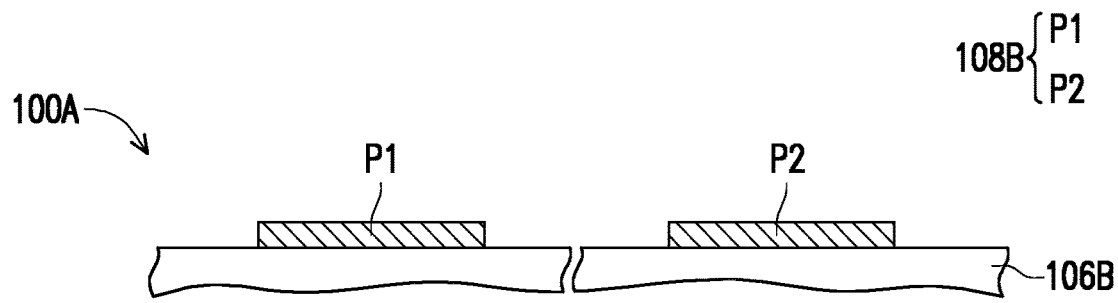
FIGS. 2-9 are schematic cross-sectional views of various stages of forming external terminals with varying heights over a circuit substrate in accordance with some embodiments.
Figure 8:
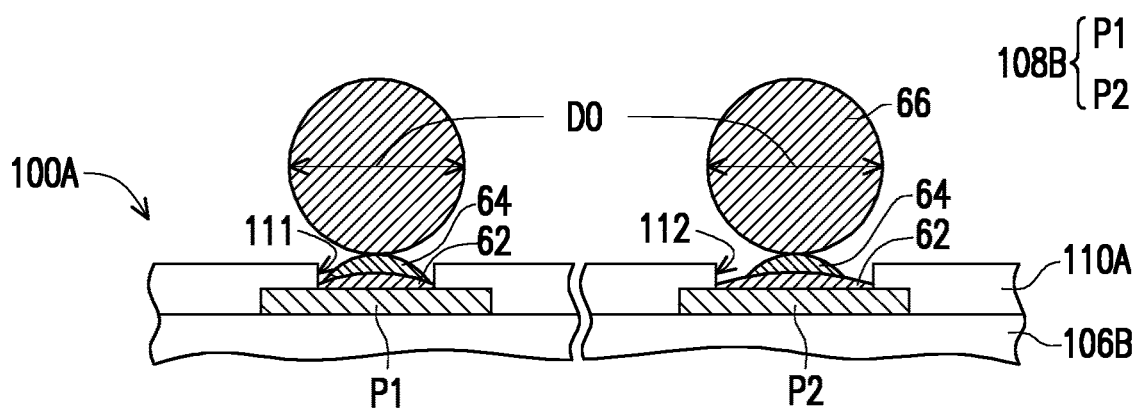
Figure 9:
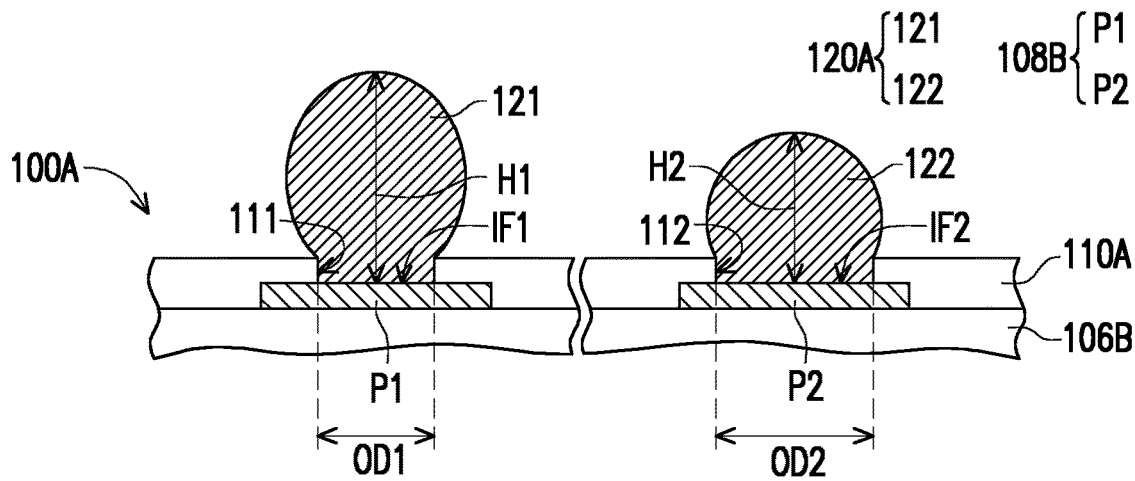
Figure 10:
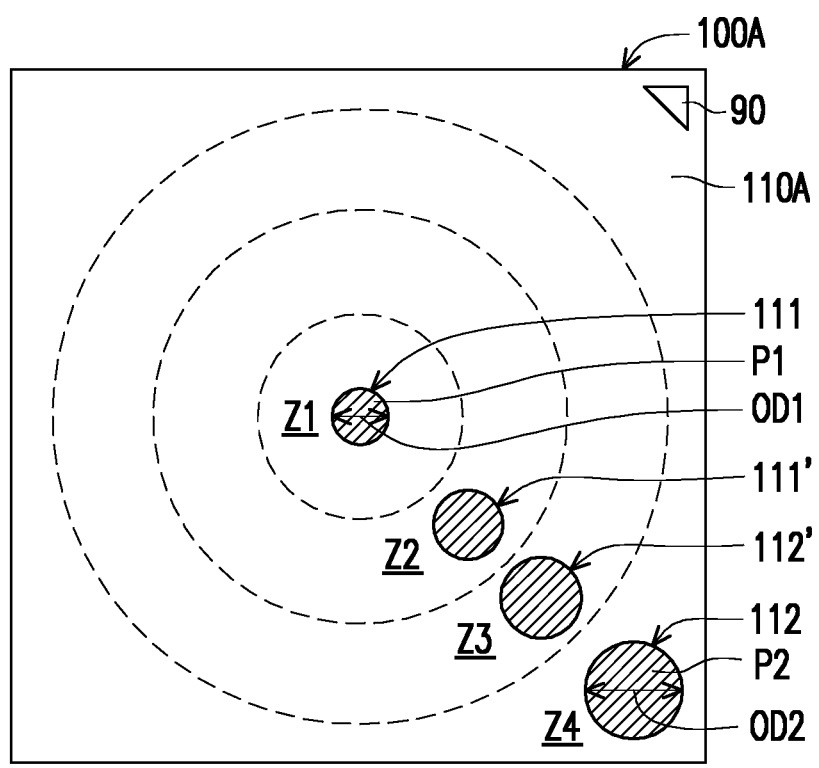
FIG. 10 is a schematic top view of a patterned mask layer with varying openings formed on a circuit substrate in accordance with some embodiments.

FIGS. 2-9 are schematic cross-sectional views of various stages of forming external terminals with varying heights over a circuit substrate in accordance with some embodiments, and FIG. 10 is a schematic top view of a patterned mask layer with varying openings formed on a circuit substrate in accordance with some embodiments. Referring to FIG. 2, the circuit substrate 100A including the conductive pattern 108B formed on the dielectric layer 106B is shown. It is noted that the circuit substrate 100A illustrated in FIG. 2 is a simplified view of the circuit substrate 100A shown in FIG. 1, and thus the details regarding the circuit substrate 100A may be found in the discussion of the embodiments shown in FIG. 1. In some embodiments, the conductive pattern 108B includes contact pads (e.g., P1 and P2) for subsequently-formed external terminals mounting thereon. The contact pad P1 may be located at the central region of the circuit substrate 100A in a top view (not shown), while the contact pad P2 may be located at the peripheral (or corner) region of the circuit substrate 100A in the top view. Alternatively, the contact pad P1 may be located at the center, while the contact pad P2 may be located at the corner.

Figure 3:
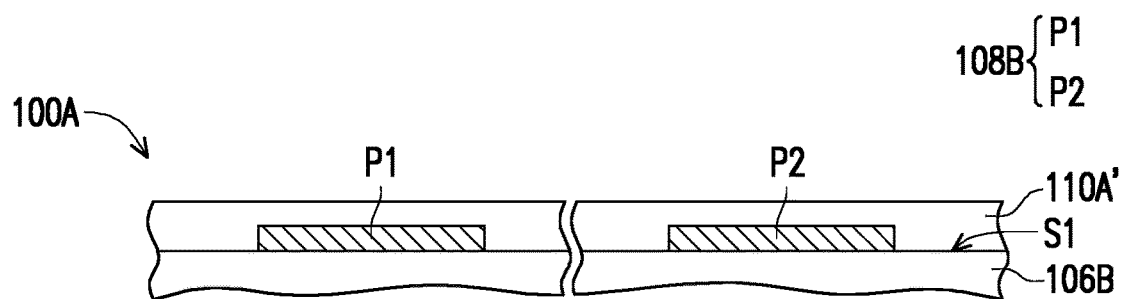

Referring to FIGS. 3, a mask layer 110A' is formed over the first side S1 of the circuit substrate 100A. In some embodiments, the first side S1 including the top surfaces of the conductive pattern 108B and the dielectric layer 106B is viewed as a major surface of the circuit substrate 100A. For example, the mask layer 110A' is formed on the dielectric layer 106B to cover the contact pads (e.g., P1 and P2) of the conductive pattern 108B by such as a coating process, a printing process, or other suitable deposition process. The mask layer 110A' may include a non-conductive material such as epoxy, polymer, photoresist, or the like. The mask layer 110A' may be made of any suitable insulating material having the feature (e.g., excellent reliability, low CTE, low shrinkage support, excellent heat resistance, combinations of these, etc). The mask layer 110A' may be formed using a liquid-type (or film-type) photosensitive solder resist. In some embodiments in which subsequently-formed external terminals are made of solder materials, the mask layer 110A' is referred to as a solder mask layer or a solder resist layer.

Figure 4:
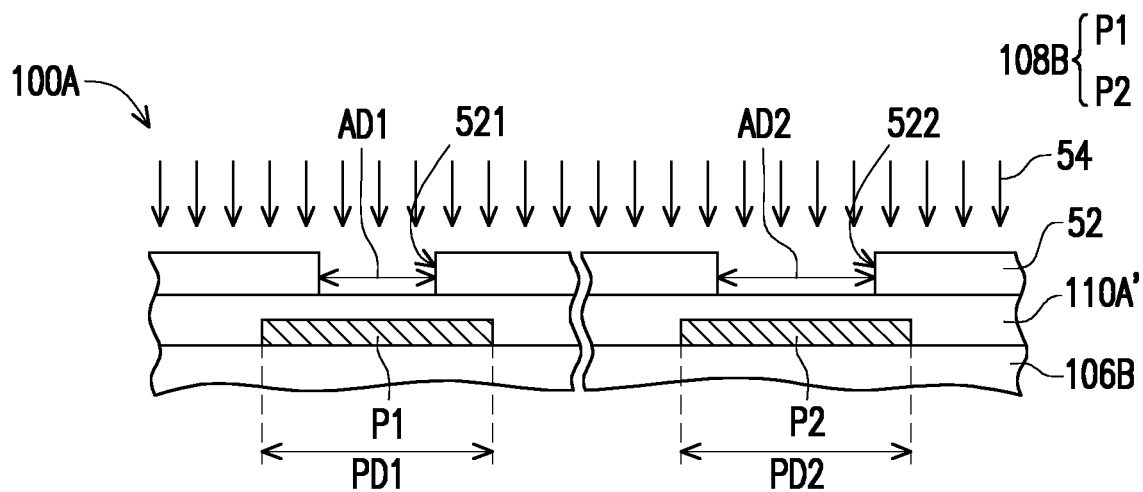
Figure 5:
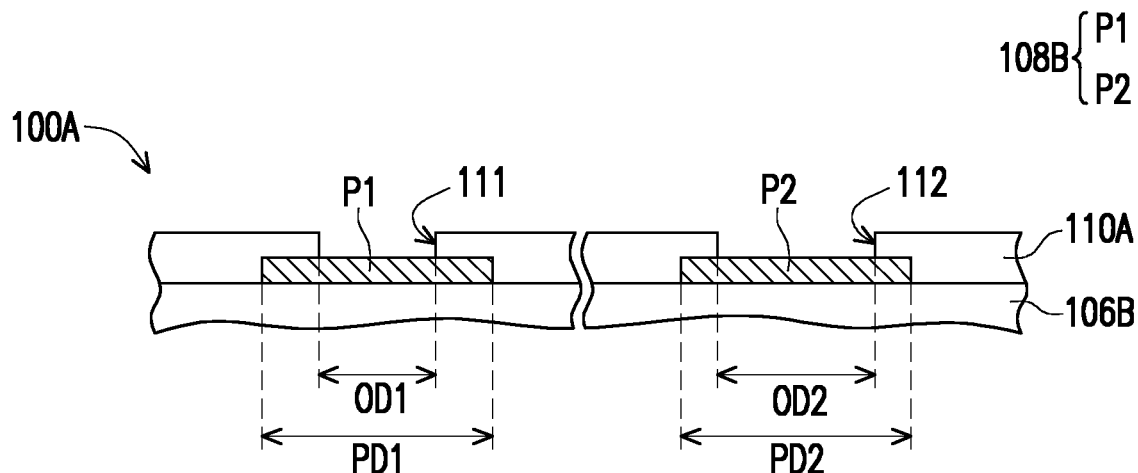

Referring to FIGS. 4-5, portions of the mask layer 110A' are removed to form a patterned mask layer 110A with a plurality of openings (e.g., 111, 112) having different opening sizes. In some embodiments, the removal of the portions of the mask layer 110A' includes the following steps. An exposure mask 52 with apertures (e.g., 521, 522) may be disposed over or directly on the mask layer 110A'. In some embodiments, the exposure mask 52 is abutted against the mask layer 110A'. Alternatively, the exposure mask 52 is located over the mask layer 110A' without directly in contact with the mask layer 110A'. Next, the energy 54 (e.g., light source, radiation, etc.) may be projected onto the mask layer 110A' through the exposure mask 52. In some embodiments, the apertures (521, 522) are used to expose certain regions of the mask layer 110A' to the energy 54 while blocking the energy 54 at other regions. The predetermined amplitude (or intensity) of the energy 54 may determine an amount of material that is removed from the mask layer 110A'.

In some embodiments, the apertures (e.g., 521, 522) are aligned with the predetermined locations corresponding to the contact pads (e.g., P1, P2) of the conductive pattern 108B. For example, the apertures (e.g., 521, 522) include a circular top-view shape. Although the apertures may include other top-view shapes (e.g., ovular, rectangular, polygonal, and/or the like). In some embodiments, widths (or diameters) of the apertures (521, 522) are less than widths (or diameters) of the corresponding contact pads (P1, P2). For example, a lateral dimension AD1 of the aperture 521 disposed directly over the contact pad P1 is less than a lateral dimension PD1 of the contact pad P1. A lateral dimension AD2 of the aperture 522 disposed directly over the contact pad P2 may be less than a lateral dimension PD2 of the contact pad P2. The lateral dimensions of the contact pads may be substantially the same or may be different, which depend on the circuit requirements. In some embodiments, the apertures (521, 522) are of varying sizes and used to form openings of the patterned mask layer with varying sizes. For example, the lateral dimension AD1 of the aperture 521 and the lateral dimension AD2 of the aperture 522 are of different values. In some embodiments, the lateral dimension AD1 is less than the lateral dimension AD2. Alternatively, the lateral dimension AD1 is greater than the lateral dimension AD2.

With continued reference to FIGS. 4-5, the portions of the mask layer 110A' corresponding to the apertures (521, 522) of the exposure mask 52 may be removed to accessibly reveal at least a portion of the corresponding contact pad (P1, P2). For example, after exposing the mask layer 110A' to the energy 54 using the exposure mask 52, the exposure mask 52 is removed, and then a developing process may be performed to the mask layer 110A' so as to form the patterned mask layer 110A with the openings (e.g., 111 and 112). Depending on the material characteristics of the mask layer 110A', an etching process may be subsequently performed to form the openings in the mask layer 110A' in accordance with some embodiments. In some embodiments in which the patterned mask layer 110A is a solder resist layer, the openings (e.g., 111, 112) are referred to as solder resist openings (SROs). It should be understood that the steps of forming the openings of the patterned mask layer shown in FIGS. 4-5 are merely examples, other suitable process (e.g., a laser drilling process or the like) may be used to form the openings with varying dimensions. The sizes of individual openings may be determined based on the simulation results as will be described later in other embodiments.

With continued reference to FIG. 5, the openings (111, 112) of the patterned mask layer 110A corresponding to the apertures (521, 522) of the exposure mask 52 are of varying sizes. For example, a portion of the contact pad P1 is accessibly exposed by the opening 111, and thus a lateral dimension OD1 of the opening 111 is less than the lateral dimension PD1 of the contact pad P1. Similarly, a lateral dimension OD2 of the opening 112 is less than the lateral dimension PD2 of the contact pad P2. In some embodiments, the openings 111 and 112 may be of varying sizes, and the contact areas of the contact pads P1 and P2 may be different. The opening sizes are in proportional to the contact areas of the contact pads. In some embodiments, the lateral dimension OD1 is less than the lateral dimension OD2. Under such scenario, the contact area of the contact pad P1 revealed by the opening 111 may be less than the contact area of the contact pad P2 revealed by the opening 112. The ratio of (OD1/PD1) may be less than the ratio of (OD2/PD2). Alternatively, the lateral dimension OD1 is greater than the lateral dimension OD2, and thus the contact area of the contact pad P1 may be greater than the contact area of the contact pad P2, and the ratio of (OD1/PD1) may be greater than the ratio of (OD2/PD2).

Still referring to FIG. 5 and further referencing FIG. 10, FIG. 10 shows a schematic top view of the openings of the patterned mask layer 110A formed in different regions (e.g., Z1, Z2, Z3, Z4) of the circuit substrate 100A, in accordance with some embodiments. It should be noted that there are other openings other than these four openings illustrated in FIG. 10; however, they are not shown. In some embodiments, the sizes of openings (e.g., 111, 111', 112', 112) of the patterned mask layer 110A may increase from the central region (e.g., Z1) of the circuit substrate 100A to the peripheral region (e.g., Z4) of the circuit substrate 100A. Since the opening sizes are in proportional to the contact areas of the contact pads, the contact area of the contact pads may increase from the central region to the peripheral region. For example, the circuit substrate 100A is divided into multiple regions depending on different levels of warpage/stress based on the simulation results (and/or Moiré measurements of sample packages). Alternatively, depending on the warpage characteristics, the opening size of the patterned mask layer may decrease from the central region of the circuit substrate to the peripheral region of the circuit substrate. Under this scenario, the lateral dimension of the opening located in the central region is greater than the lateral dimension of the opening located in the peripheral region. Although other configuration of the opening sizes may be possible.

It is noted that four regions (Z1, Z2, Z3, Z4) shown in FIG. 10 is merely an example, and the region distribution may be divided into fewer regions or more than four regions. It is also noted that the patterned mask layer 110A may include other sizes and/or other numbers and densities of the openings. In some embodiments, to ensure that the desired opening sizes are formed in each region across the circuit substrate, at least one reference mark 90 (or alignment mark) is used. The number and the shape of the reference mark 90 may depend on the process requirements and construe no limitation in the disclosure. For example, the alignment is performed within an exposure tool (not shown) to align the circuit substrate 100A using the reference mark 90 prior to the exposure process.

Figure 6:
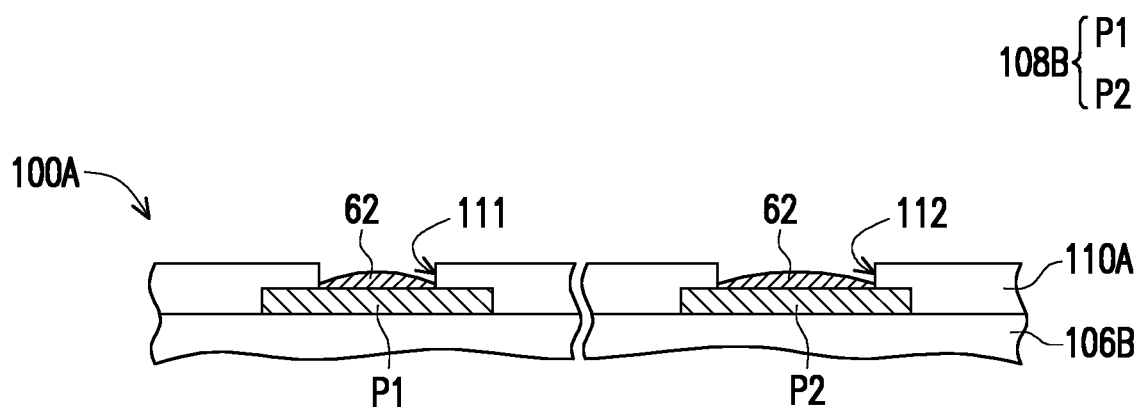

Referring to FIG. 6, a pre-solder material 62 may be formed on the contact pads (e.g., P1, P2) within the openings (e.g., 111, 112) of the patterned mask layer 110A. For example, the pre-solder material 62 is formed by plating, printing, or any suitable deposition process. The pre-solder layer 36 may include suitable material(s) which can be melted and combined together with the subsequently-placed conductive balls. In some embodiments in which solder balls are to be mounted, the pre-solder material 62 may include tin, an alloy of tin and lead, an alloy of tin and silver, an alloy of tin and zinc, an alloy of tin and copper, an alloy of tin, silver and copper, and/or the like. Alternatively, the pre-solder material is omitted.

Figure 7:
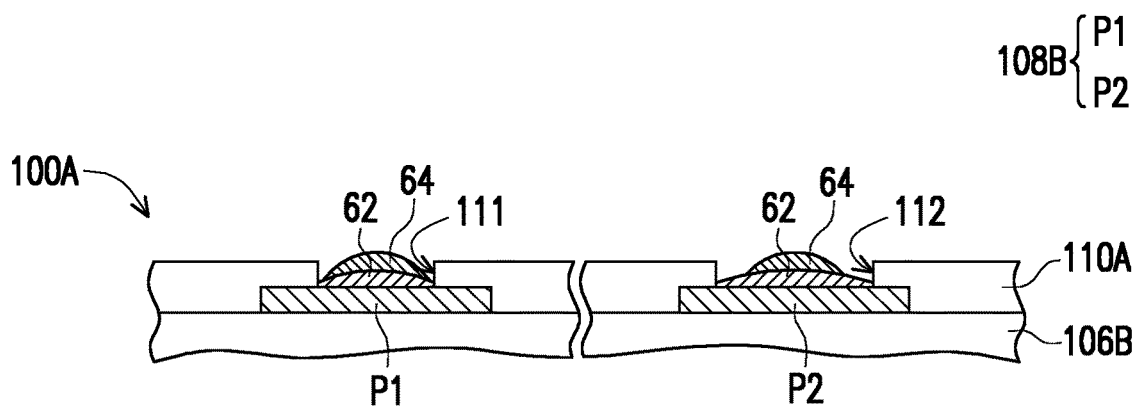

Referring to FIG. 7, a flux material 64 may be formed over the contact pads (e.g., P1, P2). In some embodiments, the flux material 64 is deposited as a paste for soldering. For example, the flux material 64 is printed within the openings (e.g., 111, 112) of the patterned mask layer 110A using a stencil or a screen (not shown). The flux material 64 may be applied directly onto the pre-solder material 62. Although other suitable method (e.g., dispensing, transferring, or the like) may be used to form the flux material 64. The details of forming the flux material 64 will be described later in other embodiments. Alternatively, the flux material 64 is omitted.

Referring to FIG. 8, a plurality of conductive balls 66 may be disposed over the contact pads (e.g., P1, P2) with a one-to-one correspondence. For example, each conductive ball 66 is placed on one of the flux material 64. The conductive balls 66 may be (or may include) solder balls including an electrically conductive solder material such as tin, nickel, gold, silver, copper and alloys thereof, or combinations of other suitable conductive material(s). In some embodiments, the conductive balls 66 are substantially uniform in size and shape. For example, the conductive balls 66 having substantially the same volume are placed over the contact pads (e.g., P1, P2). In some embodiments, the diameters of the conductive balls 66 are substantially the same, where the diameter D0 is the longest straight line segment through the ball. It is understood that the sizes of the conductive balls 66 may have slight differences due to formation process variations.

In some embodiments, the respective conductive ball 66 has have a solidus temperature in a range of between about 207-217° C. or between about 211-215° C. The respective conductive ball 66 may have a liquidus temperature in a range of between 217-219° C. (e.g., 218° C.). In some embodiments, the density of the respective conductive ball 66 is in a range of about 7.4-7.5 g/cm$^3$. The conductive balls 66 may have high tensile strength and good elongation. For example, the tensile strength of the respective conductive ball 66 at room temperature is in a range of about 49-91 MPa (e.g., between 68-77 MPa), and the elongation of the respective conductive ball 66 at room temperature is in a range of about 37-61% (e.g., 43-48%). In some embodiments, the coefficient of thermal expansion (CTE) of the respective conductive ball 66 is in a range of about 21-23 ppm/° C. (e.g., 22 ppm/° C.) (with TMA). In some embodiments, the Young's Modulus of the respective conductive ball 66 at room temperature is in a range of about 51-56 Gpa (e.g., 55 Gpa). Although the aforementioned values above/below these ranges may be applicable, in accordance with some embodiments.

In some embodiments, the conductive balls 66 are placed using a ball placement process. For example, the conductive balls 66 are held by a ball-mounting apparatus (not shown) and then released by the ball-mounting apparatus to drop into the openings (e.g., 111, 112) of the patterned mask layer 110A. The details of the ball-mounting step are described in the following embodiments. The conductive balls 66 are then attached to the underlying structure through the flux material 64. For example, each of the conductive balls 66 is located corresponding to the flux material 64 in one of the openings. Although the conductive balls 66 may be replaced with solder paste, in accordance with some embodiments.

Referring to FIG. 9, the conductive balls 66 may be reflowed to thereby form external terminals 120A (e.g., including 121 and 122). For example, a reflow process is performed to the conductive balls 66 by raising their temperature. In some embodiments, the reflow temperature is higher than about 207-220° C., and hence conductive balls 66 are melted. The reflow process may be performed at the operation temperature ranging from about 235-255° C., depending on material contents of the conductive balls 66. During the reflow process, the conductive balls 66 and the underlying materials (e.g., the flux material 64 and the pre-solder material 62) may be combined together to form the external terminals 120A. It should be understood that during the reflow process, the application of heat may cause warpage in the structure; however, the bending condition of the structure is not specifically illustrated in FIG. 9. The details related to the warpage will be explained later in accompanying with figures.

After the reflow process, the solder materials may be allowed to cool off and solidify so as to form desired ball shapes. In some embodiments, with the help of the flux material 64, the conductive balls 66 are bonded to the contact pads (e.g., P1, P2) of the circuit substrate 100A.

Each of the openings (e.g., 111, 112) of the patterned mask layer 110A may be filled by one of the external terminals 120A (e.g., including 121 and 122). For example, the external terminals (e.g., 121, 122) are electrically and physically coupled to the contact pads (e.g., P1, P2). Afterwards, the residue of the flux material is optionally cleaned, e.g., using water or any suitable cleaning method.

With continued reference to FIG. 9, the external terminals 120A may have varying heights. Due to the placement of conductive balls 66 with the same volume, the heights of the external terminals 120A may be designed to be in proportional to the sizes of the corresponding openings (e.g., 111, 112) of the patterned mask layer 110A. The smaller the opening size is, the greater the height of the external terminal is formed. In some embodiments, the external terminal 121 formed in the opening 111 having the smaller lateral dimension OD1 has a maximum height H1 greater than a maximum height H2 of the external terminal 122 formed in the opening 112 having the larger lateral dimension OD2. In some embodiments, since the conductive balls 66 are substantially uniform in size, the external terminals 120A are substantially uniform in volume. The greater the contact area of the contact pad is, the less the height of the external terminal is formed thereon. For example, the greater the contact area of the contact pad is revealed by the patterned mask layer, the greater the interface between the contact pad and the external terminal is. In some embodiments, the interface IF1 between the external terminal 121 and the contact pad P1 having the smaller contact area revealed by the opening 111 is less than the interface IF2 between the external terminal 122 and the contact pad P2 having the larger contact area revealed by the opening 112.

The maximum height H1 of the external terminal 121 may be the shortest distance between a virtual plane where the vertex point of the external terminal 121 is located on and a virtual plane where the interface of the external terminal 121 and the contact pad P1 is located on. Similarly, the maximum height H2 of the external terminal 122 may be the shortest distance between a virtual plane where the vertex point of the external terminal 122 is located on and a virtual plane where the interface of the external terminal 122 and the contact pad P2 is located on. In some embodiments, the greater the height of the external terminal is, the less the radius of curvature of the cross-sectional profile of the external terminal is. For example, the radius of curvature of the cross-sectional profile of the external terminal 121 is less than the radius of curvature of the cross-sectional profile of the external terminal 122.

Figure 11:
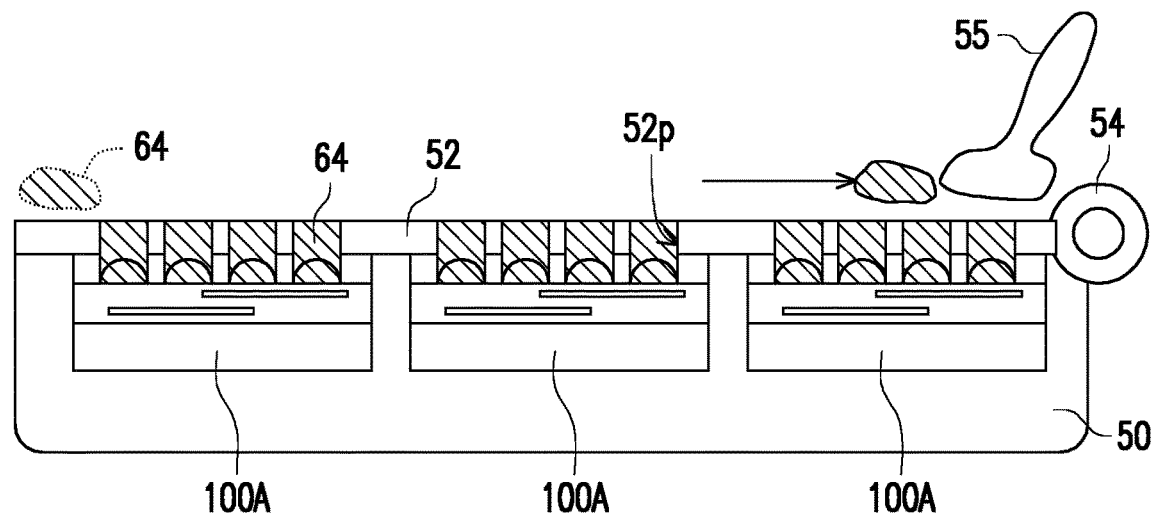
FIGS. 11-15 are schematic cross-sectional views of various stages of forming external terminals in accordance with some embodiments.
Figure 12:
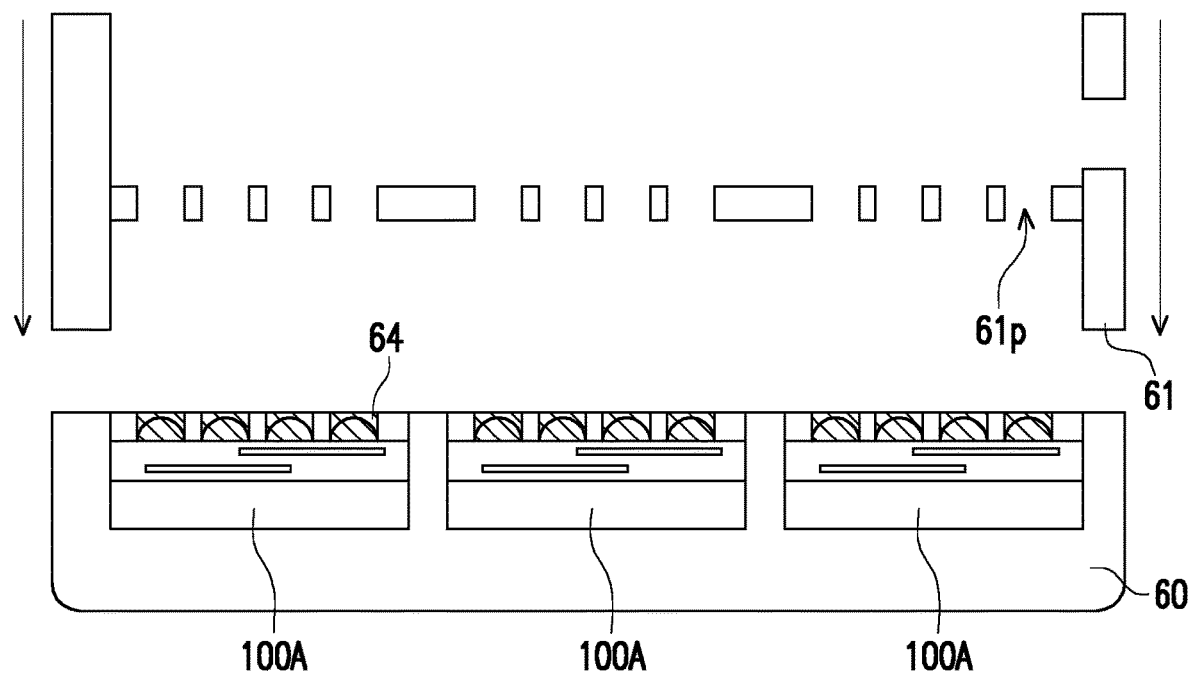

FIGS. 11-15 are schematic cross-sectional views of various stages of forming external terminals in accordance with some embodiments. The manufacturing method shown in FIGS. 11-15 may correspond to the steps shown in FIGS. 7-9, and like reference numbers are used to designate like elements. Referring to FIGS. 11-12, a plurality of the circuit substrates 100A may be placed on a tray 50, and then the flux material 64 may be printed within the openings of the circuit substrates 100A using a stencil 52 which may be engaged with the tray 50 through a hinge 54. The stencil 52 includes a plurality of openings 52p corresponding to the openings (e.g., 111, 112 in FIG. 7) of the respective circuit substrate 100A, where the opening size of the stencil 52 may be smaller than the opening size of the circuit substrate 100A. After the stencil 52 is disposed above the circuit substrates 100A, each of the openings 52p of the stencil 52 corresponds to one of the openings of the respective circuit substrate 100A. It is noted that the circuit substrate 100A is illustrated in a simplified manner and may be similar to the circuit substrate 100A described in the previous embodiments.

The flux material 64 may be applied to the stencil 52 using a tool 55 (e.g., brush, blade, wiper, etc.). For example, the tool 55 may brush across the circuit substrate 100A back and forth as indicated by the arrow to apply the flux material 64 in the openings. The movement of the tool 55 may be performed manually or automatically. After forming the flux material 64 on the circuit substrates 100A, the stencil 52 may be removed, and the circuit substrates 100A placed in the tray 50 may be transferred to another tray 60 for ball-mounting. Subsequently, another stencil 61 including a plurality of openings 61p may be placed over the tray 60 as indicated by the arrows.

Figure 13:
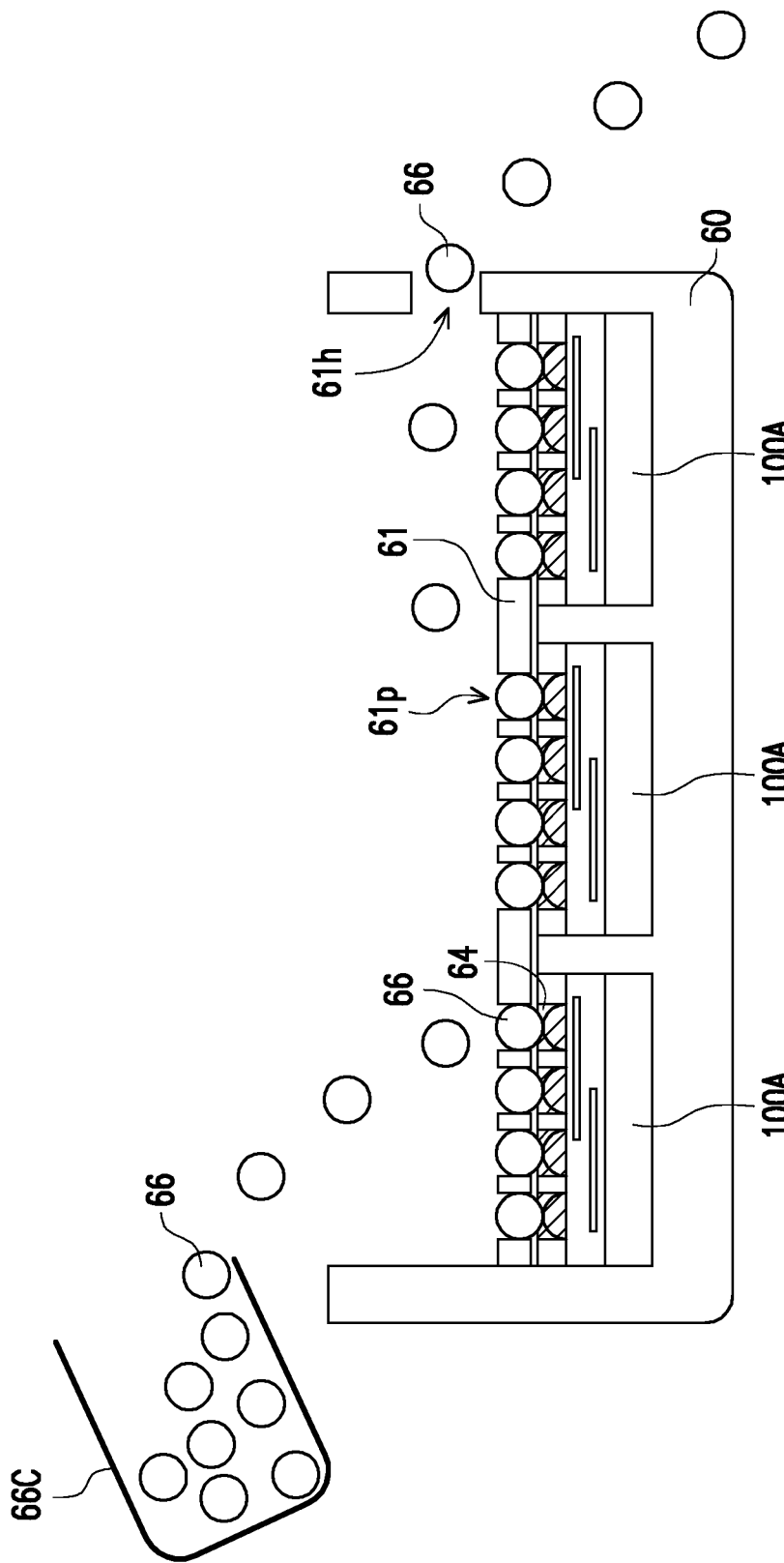
Figure 14:
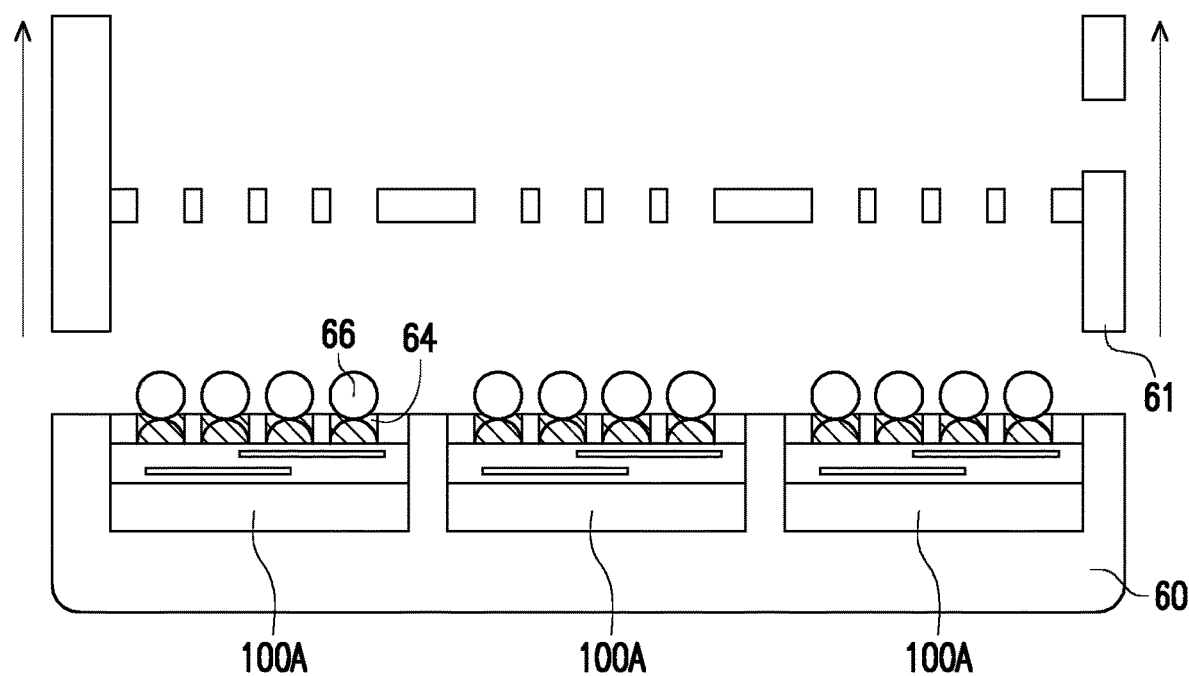
Figure 15:
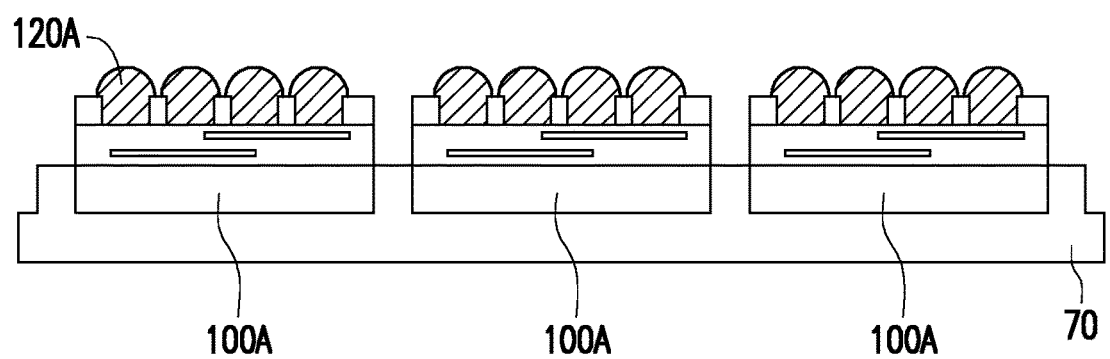

Referring to FIGS. 13-15, a plurality of conductive balls 66 in a container 66C may be provided, and then the conductive balls 66 in the container 66C may be dropped (e.g., allowed to fall) into the openings 61p of the stencil 61 manually or automatically. For example, each of the openings 61p of the stencil 61 corresponds to one of the openings of the respective circuit substrate 100A, so that the conductive balls 66 may be located in the openings 61p of the stencil 61 and attached to the flux material 64 in a one-to-one correspondence. In some embodiments, the excess conductive balls 66 may exit from the hole 61h at the sidewall of the stencil 61. Subsequently, the stencil 61 may be removed as indicated by the arrow shown in FIG. 14. Afterwards, the circuit substrates 100A with the conductive balls 66 attached thereon may be transferred to another tray 70 for reflowing. After the reflow, the external terminals 120A are formed on the respective circuit substrate 100A. The residue of the flux material on the respective circuit substrate 100A may be cleaned. The reflow step is similar to the step described in FIG. 9.

Figure 16:
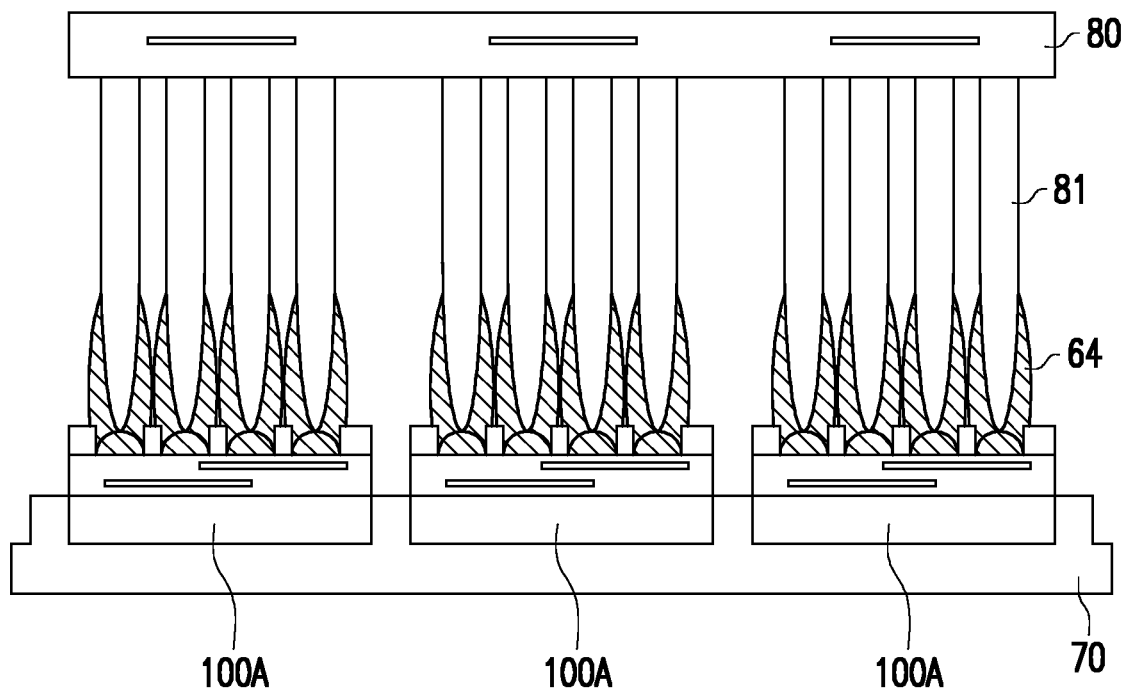
FIGS. 16-19 are schematic cross-sectional views of various stages of forming external terminals in accordance with some embodiments.

FIGS. 16-19 are schematic cross-sectional views of various stages of forming external terminals in accordance with some embodiments. The manufacturing method shown in FIGS. 16-19 may be similar to the manufacturing method shown in FIGS. 11-15, and like reference numbers are used to designate like elements. Referring to FIG. 16, the flux material 64 is formed in the openings of the respective circuit substrate 100A on the tray 70 by a dipping process. The step of forming the flux material 64 may correspond to the step shown in FIG. 7. For example, a dipping apparatus 80 including a plurality of pins 81 is initially submerged in a flux bath (not shown) to coat the pins 81 with the flux material 64. In some embodiments, the flux material 64 having a relatively high viscosity stays attached to the pins 81 in an amount, and then the flux material 64 may be transferred onto the circuit substrates 100A. This step may be referred to as flux stamping.

Figure 17:
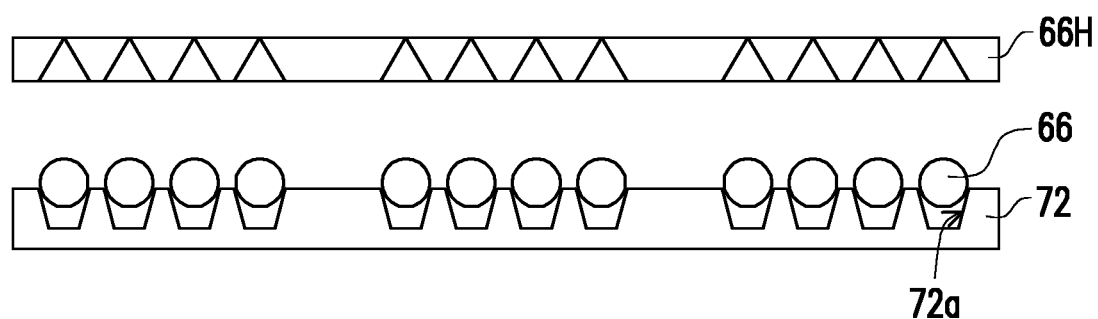
Figure 18:
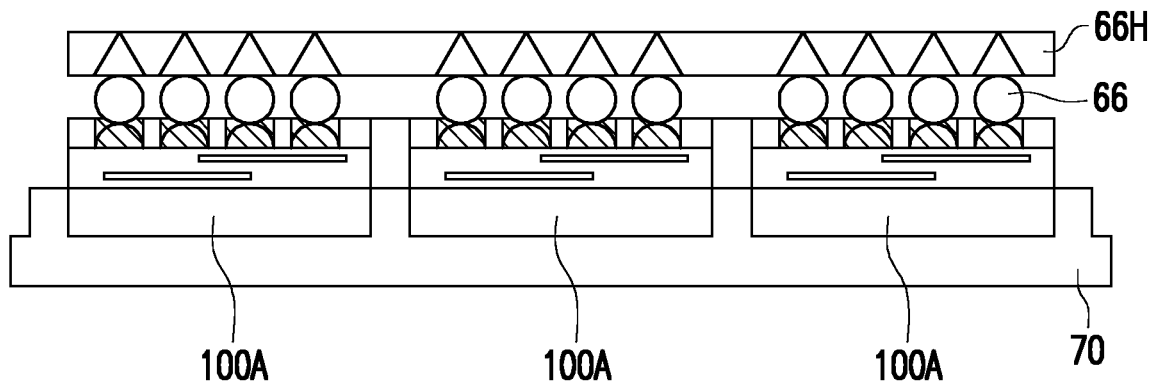

Referring to FIGS. 17-18, a plurality of conductive balls 66 placed on recesses 72a of a tray 72 is provided. For example, each of the conductive balls 66 is located at one of the recesses 72a. In some embodiments, a holding apparatus 66H is positioned above the tray 72, and then the conductive balls 66 on the tray 72 may be held by the holding apparatus 66H and disposed on the circuit substrates 100A. For example, the holding apparatus 66H is equipped with a vacuum system (e.g., vacuum pump, controller, etc.), so that the conductive balls 66 on the tray 72 may be held by the holding apparatus 66H through vacuum suction. The holding apparatus 66H may include other suitable engaging mechanism to transfer the conductive balls 66.

Figure 19:
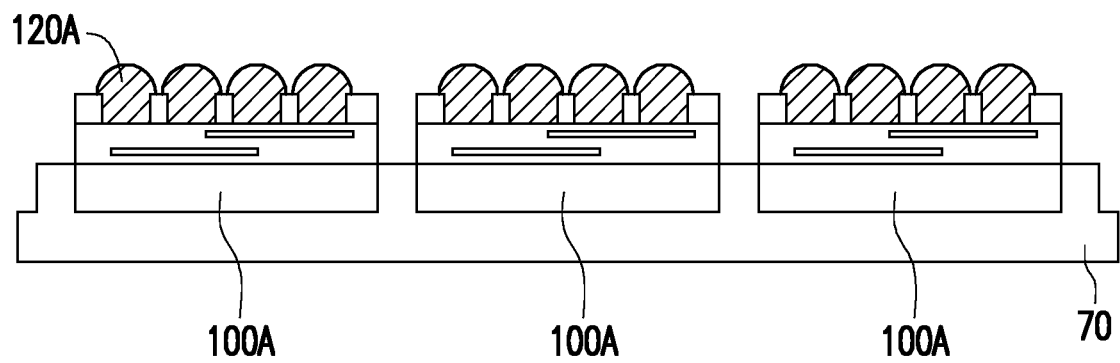

Referring to FIG. 19, after placing the conductive balls 66 in the openings of the respective circuit substrate 100A, the reflow process may be performed to form the external terminals 120A. In some embodiments, the aforementioned steps (e.g., flux dipping, flux stamping, and ball implementation) are automatically performed, and a post-mounted inspection process is performed before the reflow process to ensure the conductive balls 66 are located at the right place. After the reflow, the residue of the flux material is optionally cleaned. The reflow step is similar to the step described in FIG. 9.

Figure 20:
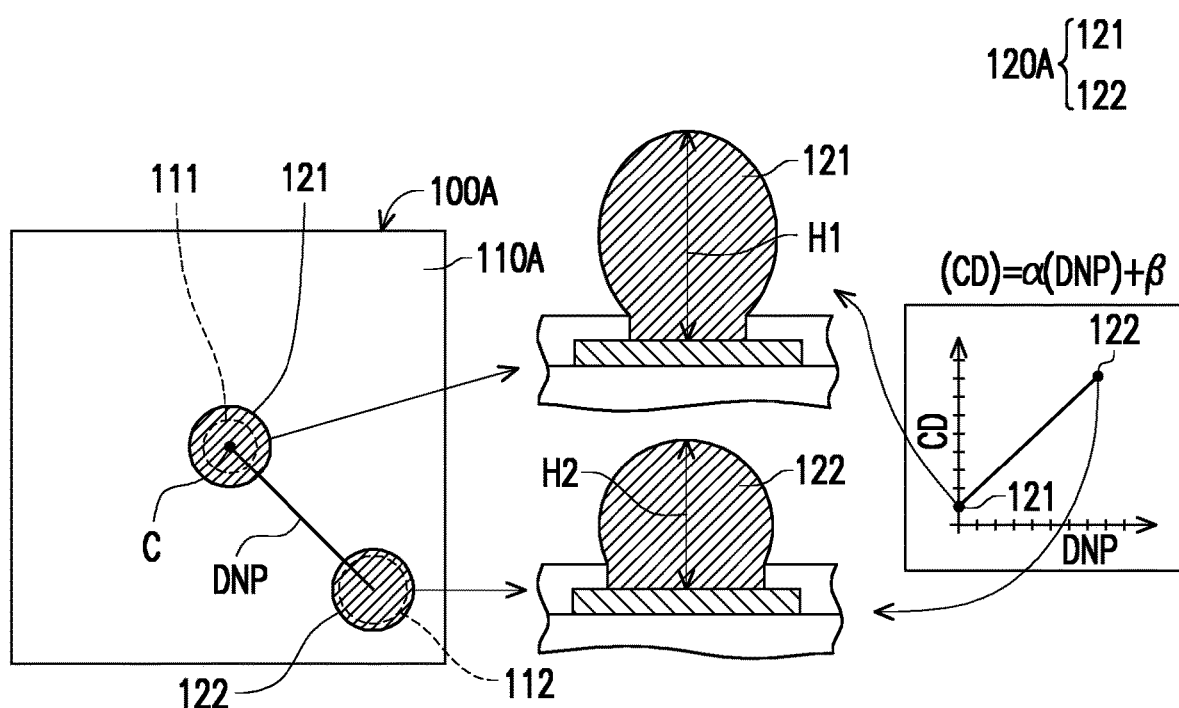
FIG. 20 is a schematic top and cross-sectional views of external terminals formed over a circuit substrate in accordance with some embodiments.

FIG. 20 is a schematic top and cross-sectional views of external terminals formed over a circuit substrate in accordance with some embodiments. It should be noted that there are other external terminals 120A formed over the circuit substrate 100A other than the external terminals 121 and 122; however, they are not illustrated for a better understanding of the concepts of the disclosure. Referring to FIG. 20, the heights (e.g., H1, H2) of the external terminals 120A may depend on the location of the respective external terminal on the circuit substrate 100A and may depend on stress and strain levels of different products.

In some embodiments, the stresses on the external terminals 120A formed on the circuit substrate 100A depend on the distance of the respective external terminal 120A to the center C of the circuit substrate 100A. The center C of the circuit substrate 100A may be viewed as a stress neutral point. For example, the external terminals formed at the center C of the circuit substrate 100A have the lowest stress. The distance of the external terminal 122 (or called corner terminal) to the center C of the circuit substrate 100A may be referred to as the distance to neutral point (DNP). The external terminals 120A formed on different regions with varying DNPs may have different stress levels.

In some embodiments, the external terminal 122 has the highest stress and the external terminal 121 (or called center terminal) has the lowest stress. It is understood that the high stress may result in reliability and yield issues. For the external terminals having a high amount of stress (e.g., external terminal 122 formed at the corner), the adjustment of the contact area between the external terminal and the corresponding contact pad by the opening size of patterned mask layer may reduce reliability and yield issues. In some embodiments, a relationship between the critical dimensions (CD) (e.g., the lateral dimensions of the opening sizes or critical dimensions (CD) of the external terminals) and the distance to neutral points (DNP) is expressed as a linear equation: $(CD)=\alpha(DNP)+\beta$, wherein $\alpha$ may be positive factors (e.g., greater than 0) and ($\beta$ may be greater/less than or equal to 0). The equation establishes that as the distance to neutral point (DNP) increases, the critical dimension (CD) may increase. Although various equations may be established based on simulation results of different products. Since the conductive balls with substantially uniform volume are used, the height of the respective external terminal formed in the corresponding opening may be estimated based on the equation. As mentioned above, the height of the external terminal is designed to be in proportional to the opening size (CD) of the patterned mask layer. By determining the respective opening size of the patterned mask layer 110A (or the contact areas of the contact pads) across the circuit substrate 100A, the external terminals 120A formed in the corresponding openings may have height controlled, such as by increasing/decreasing their heights which depend on product requirements. Accordingly, the external terminals 120A may offer improved reliability and electrical performance.

Figure 27:
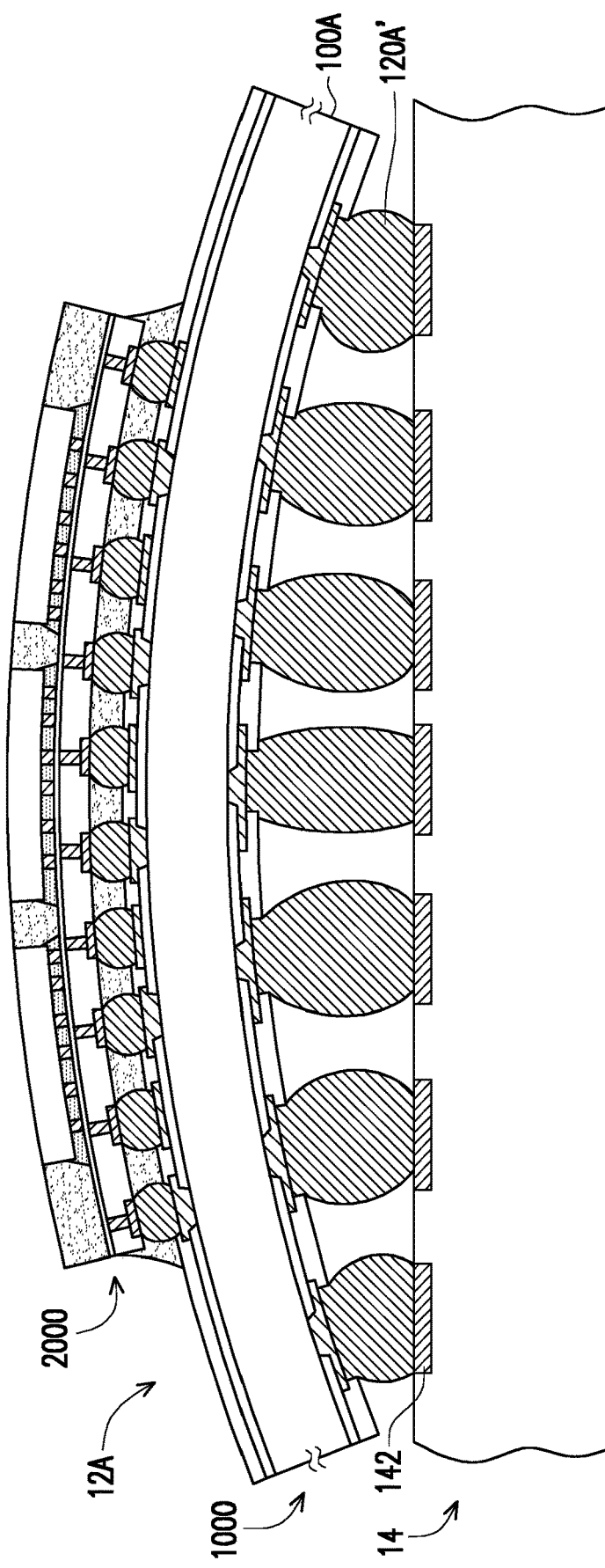
FIG. 27 is a schematic cross-sectional view of a semiconductor structure including a package structure mounted on a circuit board in accordance with some embodiments.
Figure 30:
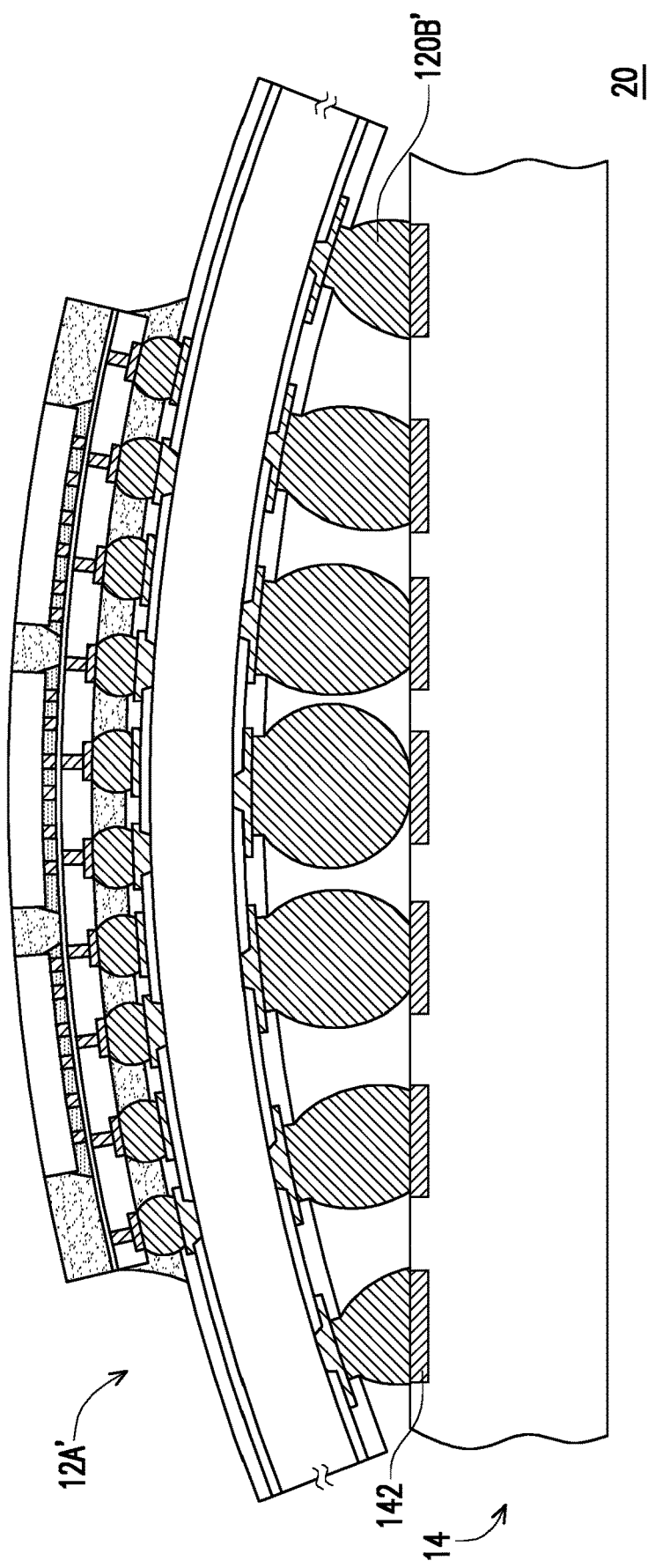
FIG. 30 is a schematic cross-sectional view of a semiconductor structure including a package structure mounted on a circuit board in accordance with some embodiments.

It is understood that heat may be applied during the reflow process, which may result in warpage of the resulting structure. For example, after forming the external terminals, the resulting structure may be bonded to a circuit board (as shown in FIG. 27 or 30), where the external terminals are disposed on and directly coupled to bond pads of the circuit board. A reflow process may be performed to the external terminals to bond to the circuit board, and as a result of the reflow process, warpage of the bonded structure may occur. For example, distances between the circuit substrate and the circuit board may vary in different areas of the bonded structure. If the heights of the external terminals are not adjusted prior to the bonding, the surfaces of the external terminals would have been non-coplanar and not in contact with all of the bond pads of the circuit board, which results in connection defects (e.g., cold-joint and/or bridging) and yield issues. In this regards, the warpage characteristics may be analyzed before the bonding or the formation of the package structure. The opening size of the patterned mask layer may be determined by the warpage characteristics based on the simulation analysis data, and the external terminals filling the openings of the patterned mask layer may have desired heights to offer improved coplanarity and reliability after the bonding. Accordingly, by configuring varying heights of the external terminals, the aforementioned issues may be advantageously eliminated. The details are explained in greater detail by means of other embodiments.

Figure 21:
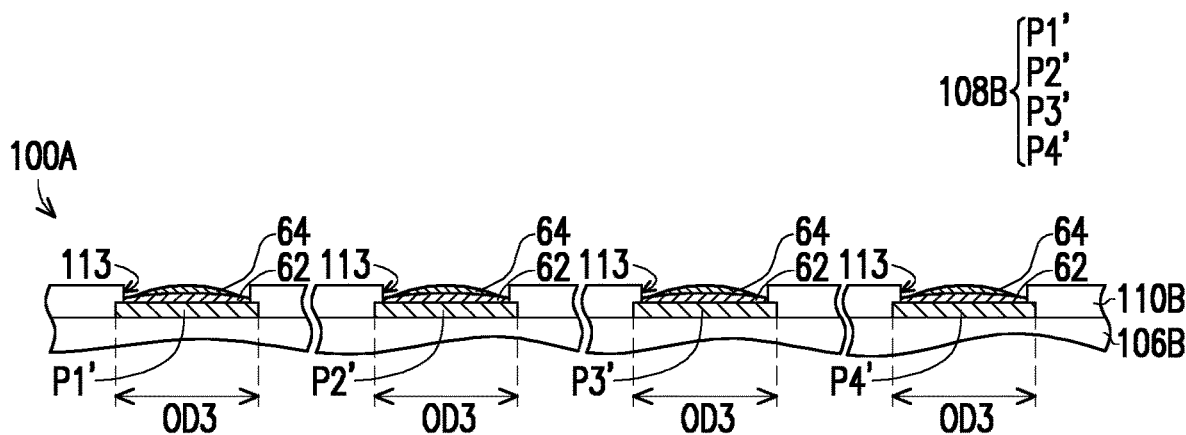
FIGS. 21-23 are schematic cross-sectional views of various stages of forming external terminals with varying heights over a circuit substrate in accordance with some embodiments.
Figure 22:
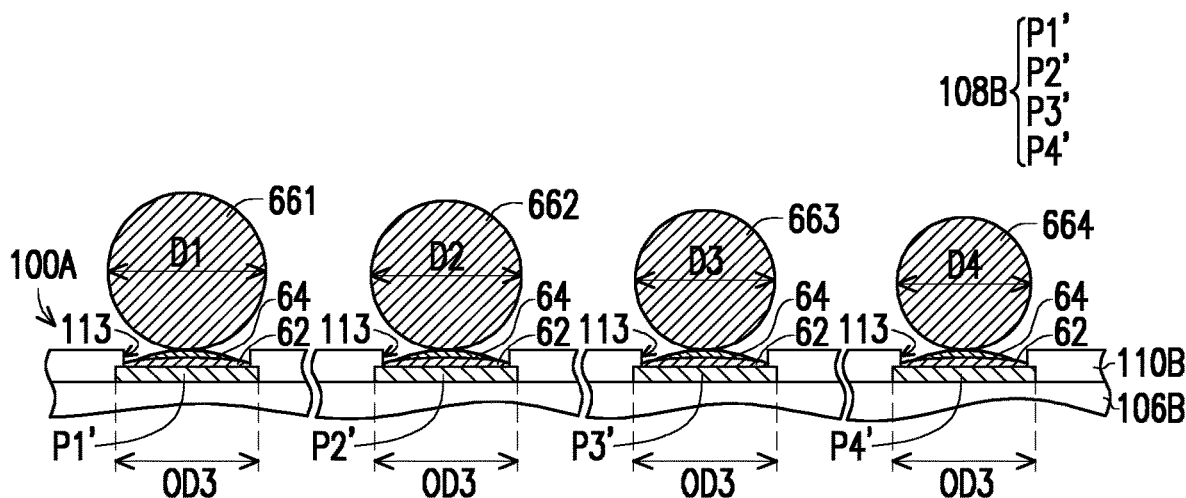
Figure 23:
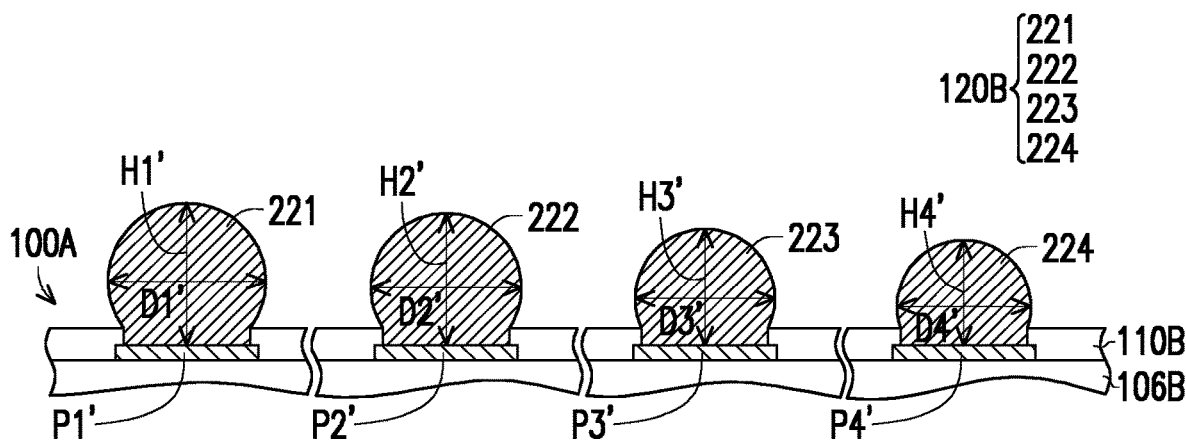
Figure 24:
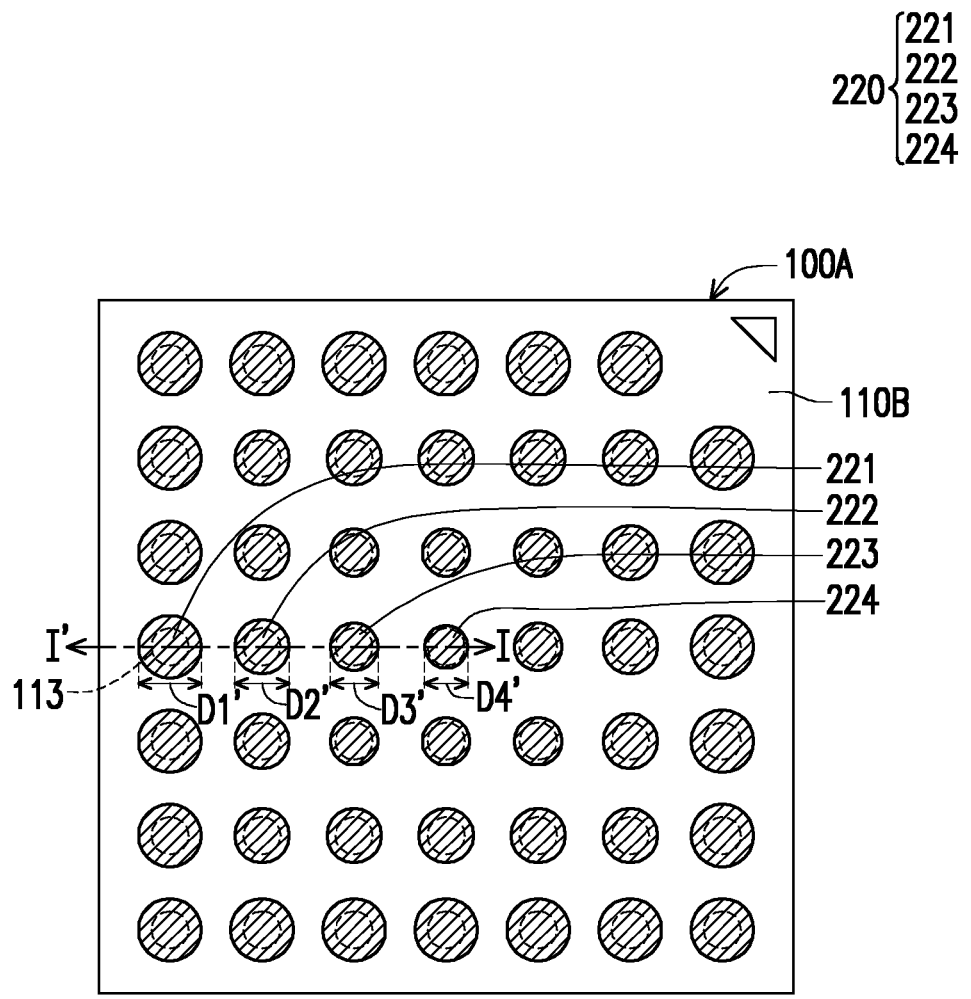
FIG. 24 is a schematic top view of external terminals with varying sizes formed over a circuit substrate in accordance with some embodiments.

FIGS. 21-23 are schematic cross-sectional views of various stages of forming external terminals with varying heights over a circuit substrate in accordance with some embodiments and FIG. 24 is a schematic top view of external terminals with varying sizes formed over a circuit substrate in accordance with some embodiments. Unless specified otherwise, the materials and the formation methods of the components in the embodiments are essentially the same as the like components, which are denoted by like reference numerals in the embodiments shown in FIGS. 1-10. The details regarding the formation process and the materials of the components shown in FIGS. 21-24 may be found in the discussion of the previous embodiments.

Referring to FIG. 21, a patterned mask layer 110B may be formed on the dielectric layer 106B of the circuit substrate 100A to partially cover the conductive pattern 108B. In some embodiments, a plurality of openings 113 of the patterned mask layer 110B accessibly exposes at least a portion of the contact pads (e.g., P1', P2', P3', P4') of the conductive pattern 108B. The forming process and the material of the patterned mask layer 110B may be similar to those of the patterned mask layer 110A described in FIGS. 3-5, and thus the detailed descriptions are not repeated for the sake of brevity. The difference between the patterned mask layers 110A and 110B includes that the sizes (e.g., widths or diameters) of the openings 113 of the patterned mask layer 110B are substantially the same. For example, the lateral dimension OD3 of the opening 113 corresponding to the contact pad P1' is substantially the same as the lateral dimension OD3 of the opening 113 corresponding to the contact pad P2' (or P3', P4'). The contact areas of the contact pads (e.g., P1'-P4') accessibly revealed by the openings 113 may be substantially equal. It is understood that the dimensions of the openings 113 may have slight differences due to formation and/or alignment process variations.

In some embodiments, after forming the patterned mask layer 110B having the openings 113 with the same size, the pre-solder material 62 is optionally formed in the contact area of the respective contact pad (e.g., P1'-P4') revealed by the openings 113. In some embodiments, the flux material 64 is optionally formed on the pre-solder material 62. The materials and the forming processes of the pre-solder material 62 and the flux material 64 may be similar to those of the pre-solder material 62 and the flux material 64 described in FIGS. 6-7, and thus the detailed descriptions are not repeated for the sake of brevity.

Referring to FIG. 22, a plurality of conductive balls (e.g., 661, 662, 663, 664) may be disposed over the contact areas of the contact pads (e.g., P1'-P4') revealed by the openings 113 of the patterned mask layer 110B. For example, the conductive balls (e.g., 661-664) are placed using a ball placement process to be attached to the flux material 64 within the individual opening 113. The ball placement process may be similar to the process described in FIG. 8, and thus the detailed descriptions are not repeated for the sake of brevity. Alternatively, the ball placement process in FIG. 8 or 22 may be replaced with other suitable method (e.g., dispensing, printing, plating, etc.) to form solder materials in the openings.

In some embodiments, the conductive balls (e.g., 661-664) are non-uniform in size. For example, the diameters (e.g., D1-D4) of the conductive balls (e.g., 661-664) are different, where the diameter is the longest straight line segment through the individual ball. In some embodiments, the diameters (D1, D2, D3, D4) of the conductive balls (661, 662, 663, 664) gradually decrease. In other words, the conductive ball 661 disposed over the contact pad PD1' has the greatest diameter D1 among the conductive balls (661-664) and the conductive ball 664 disposed over the contact pad PD4' has the smallest diameter D4. In some embodiments, the contact pads (P1'-P4') are arranged from the peripheral (or corner) region of the circuit substrate 100A to the central region of the circuit substrate 100A in the top view. Alternatively, the contact pads (P1'-P4') are arranged from the center to the corner. Although the conductive balls are illustrated as having four differently sized balls in a particular configuration, in other embodiments, the conductive balls may be any number of sizes in any configuration depending on product requirements.

Referring to FIG. 23, the conductive balls (661-664) may be reflowed to form external terminals 120B (e.g., 221-224). The external terminals 120B (e.g., 221-224) may be electrically and mechanically coupled to the contact pads (e.g., P1'-P4') of the circuit substrate 100A. Afterwards, the residue of the flux material is optionally cleaned, e.g., using water or any suitable cleaning means. The process may be similar to the process described in FIG. 9, and thus the detailed descriptions are not repeated for the sake of brevity. It should be noted that during the reflow process, the application of heat may cause warpage in the structure; however, the bending condition of the structure is not specifically illustrated in FIG. 23. The details related to the warpage of the structure will be explained later in accompanying with figures.

In some embodiments, each of the openings 113 of the patterned mask layer 110B may be filled by one of the external terminals 120B. As shown in FIG. 23, the external terminals 120B have varying heights, where the height of individual external terminal is the shortest distance between a virtual plane where the vertex point of the external terminal is located on and a virtual plane where the interface of the external terminal and the underlying contact pad is located on. The heights of the external terminals 120B may correspond to the diameters of the conductive balls before the reflow process. Thus, by varying the volume of each conductive ball, the external terminals 120B of varying heights may be formed on the circuit substrate 100A.

In some embodiments, the maximum height H2' of the external terminal 222 formed on the contact pad P2' may be substantially less than the maximum height H1' of the external terminal 221 formed aside the external terminal 222. The maximum height H3' of the external terminal 223 formed on the contact pad P3' may be substantially greater than the maximum height H4' of the external terminal 224 formed aside the external terminal 223. In some embodiments, among the external terminals 120B, the external terminal 221 formed on the contact pad P1' has the greatest maximum height H1' and the external terminal 224 formed on the contact pad P4' has the smallest maximum height H1'. In some embodiments, the greater the height of the external terminal is, the less the radius of curvature of the cross-sectional profile of the external terminal may be. In some embodiments, the radiuses of curvatures of the cross-sectional profiles of the external terminals 120 gradually decrease from the center to the corner. For example, the radius of curvature of the cross-sectional profile of the external terminal 221 is less than the radius of curvature of the cross-sectional profile of the external terminal 224.

With continued reference to FIG. 23 and further referencing FIG. 24, FIG. 23 is a cross-sectional view taken along the line I-I' of FIG. 24 in accordance with some embodiments. For example, as the conductive balls (e.g., 661-664) with different volume drop into the opening 113 having the same size during the ball placement process, the resulting diameter (e.g., D1', D2', D3', D4') of the respective external terminal (e.g., 221, 222, 223, 224) is thus different. The resulting diameter (e.g., D1', D2', D3', D4') may be the longest straight line segment through the respective external terminal (e.g., 221, 222, 223, 224). The resulting diameters of the external terminals 120B after the reflow process may correspond to the diameters of the conductive balls before the reflow process. In some embodiments, the resulting diameters of the external terminals 120B gradually decrease from the peripheral region to the central region. For example, the external terminal 221 located at the peripheral region of the circuit substrate 100A has the resulting diameter D1' larger than the resulting diameter D4' of the external terminal 224 located at the central region of the circuit substrate 100A.

It is understood that in other embodiments, the design rule of the varying opening sizes of the patterned mask layer applied in the aforementioned examples may be adopted to form the external terminals with varying heights. In some embodiments in which the external terminals formed over the circuit substrate are to be bonded to the circuit board, the external terminals are designed to have varying heights, such that all the external terminals are electrically and physically connected to the circuit board. Therefore, connection defects (e.g., cold-joints and/or bridging) are avoided and the coplanarity of the resulting structure may be improved.

Figure 25:
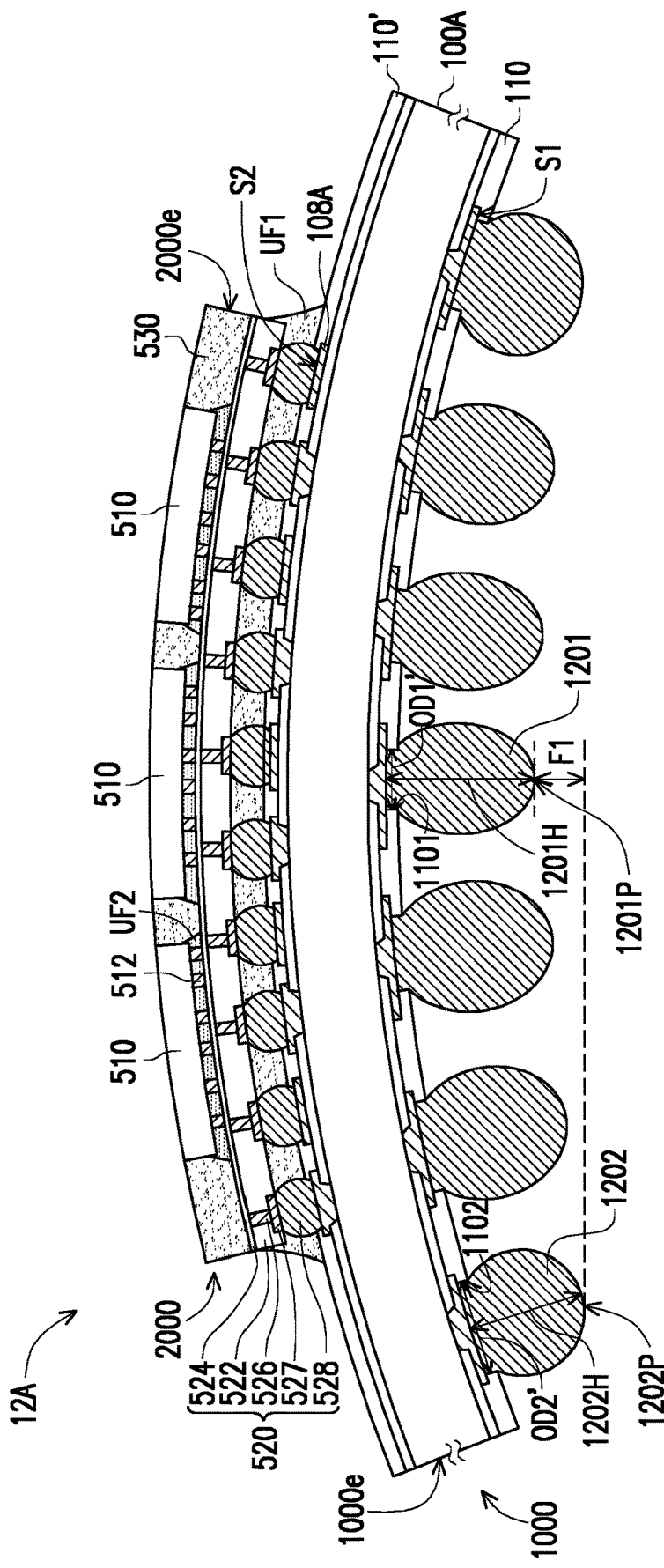
FIGS. 25-26 are schematic cross-sectional views showing a package structure before and after heating in accordance with some embodiments.
Figure 26:
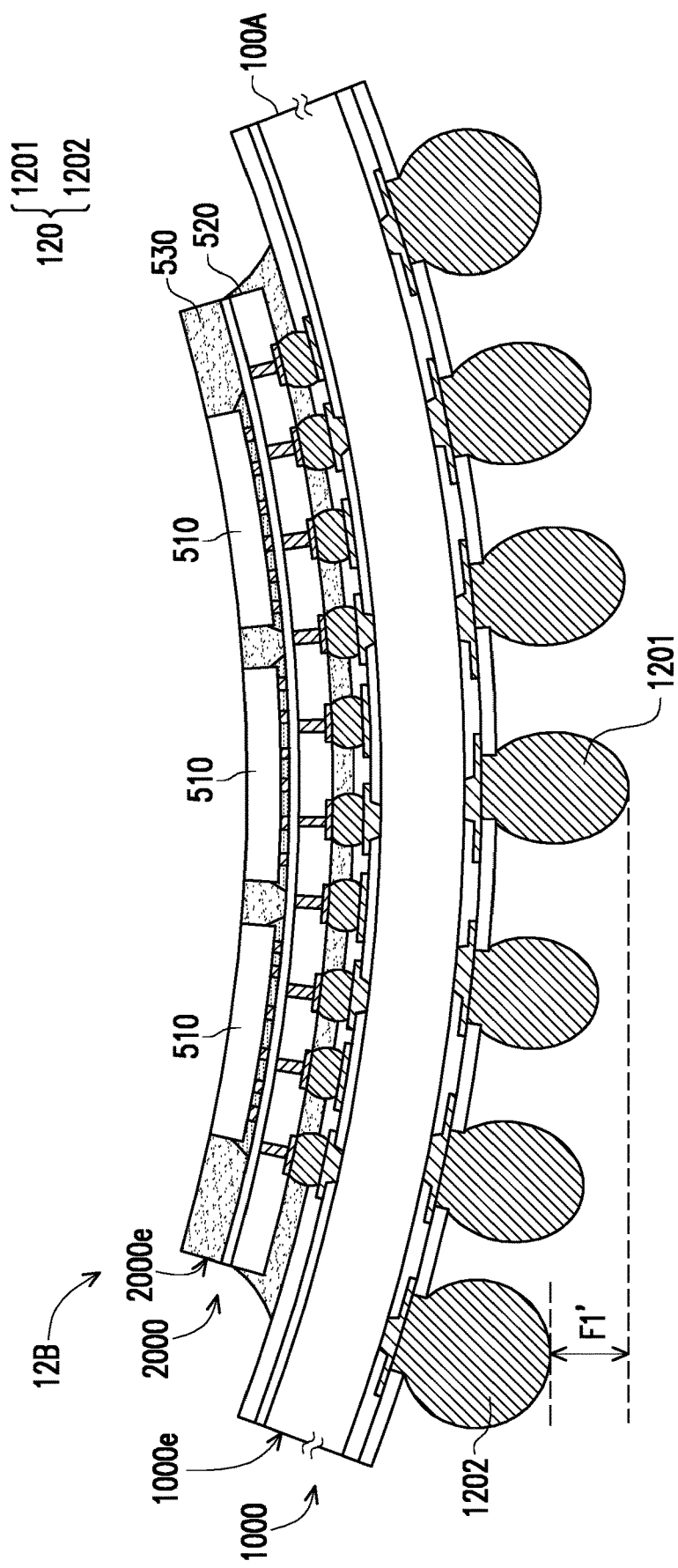

FIGS. 25-26 are schematic cross-sectional views showing a package structure before and after heating in accordance with some embodiments and FIG. 278 is a schematic cross-sectional view of a semiconductor structure including a package structure mounted on a circuit board in accordance with some embodiments. Throughout the various views and illustrative embodiments, like reference numbers are used to designate like elements. It should be noted that the circuit substrate 100A herein is illustrated in a simplified manner and may be similar to the circuit substrate 100A described in FIG. 1.

Referring to FIG. 25, a package structure 12A is provided. For example, the package structure 12A has a convex warpage at a first temperature (e.g., room temperature around 25° C. or about 25° C. to about 50° C.). The warpage may be caused by a difference in the coefficients of thermal expansion (CTEs) between different materials in the package structure 12A. Throughout the description, when the package structure is placed with the external terminals facing down, and the warpage causes the edges of the package structure to be lower than the center of the package structure, the warpage is referred to as having the convex warpage (e.g., crying profile in the cross section). In contrast, if the edges of the package structure are higher than the center of the package structure, the warpage is referred to as having the concave warpage (e.g., smiling profile in the cross section). It is noted that in other embodiments, the package structure may present complex warpages rather than simple convex or simple concave warpages.

In some embodiments, the package structure 12A includes a first package component 1000 and a second package component 2000 disposed on and electrically coupled to the first package component 1000. In some embodiments, an underfill UF1 is disposed between the first package component 1000 and the second package component 2000 to fill the gap and cover the connections therebetween for protection. In some embodiments, the underfill UF1 extends to cover at least a portion of the sidewalls of the second package component 2000. It is noted that the examples herein are provided for illustrative purposes only, and other embodiments may utilize fewer or additional components. In some embodiments, the second package component 2000 is a chip-on-wafer package or any suitable type of semiconductor package(s). For example, the second package component 2000 may be formed by bonding at least one integrated circuit (IC) die 510 to an interposer 520. Other suitable element(s) may be configured as appropriate for a given application.

In some embodiments, the respective IC die 510 includes active devices and/or passive devices (e.g., transistors, diodes, capacitors, resistors, etc.) and may be in and/or on a front surface of a semiconductor substrate (not shown) of the IC dies. For example, the respective IC die 510 has a single function (e.g., a logic device, a memory die, etc.), or may have multiple functions (e.g., a system-on-chip). For example, one of the IC dies 510 is a processor die (e.g., central processing unit (CPU), graphics processing unit (GPU), application-specific integrated circuit (ASIC), etc.) and another one of the IC dies 510 is a memory die (e.g., dynamic random access memory (DRAM) die, static random access memory (SRAM) die, high bandwidth memory (HBM) die, etc.). The IC dies 510 may include an interface die for coupling the processor die to the memory die. The respective IC die 510 may be or may include a die stack including at least two bonded IC components. For example, through substrate vias (TSVs) are formed through one or more of the IC components of the die stack, such that external connections may be made to the die stack. The bonding process of the die stack may involve hybrid bonding, fusion bonding, dielectric bonding, metal bonding, or any suitable process.

The respective IC die 510 may be electrically and physically coupled to the interposer 520 with die connectors 512. The die connectors 512 may be formed from a conductive material (e.g., solder, copper, aluminum, gold, nickel, silver, palladium, tin, alloy, and/or the like). The die connectors 512 may be or may include metal pillars, controlled collapse chip connection (C4) bumps, micro-bumps, electroless nickel-electroless palladium-immersion gold (ENEPIG) formed bumps, and/or the like. For example, the respective IC die 510 is disposed on the interposer 520 using a pick-and-place process. Subsequently, the die connectors 512 may form joints between corresponding connectors on the interposer 520 and the respective IC die 510 and may electrically connect the interposer 520 to the respective IC die 510. In some embodiments, after coupling the die connectors 512 to the interposer 520, an underfill UF2 is formed between the IC dies 510 and the interposer 520 to at least surround the die connectors 512 for protection. Alternatively, the underfill UF2 is omitted.

In some embodiments, an insulating encapsulation 530 is formed on the interposer 520 to encapsulate the IC dies 510 (and the underfill UF2 in some embodiments). The insulating encapsulation 530 may be or may include a molding compound, a molding underfill, epoxy resin, and/or the like, and may be applied by a molding process or any suitable technique. In some embodiments, the insulating encapsulation 530 is thinned to expose top surfaces of the IC dies 510 by chemical-mechanical polishing (CMP), grinding, etching, and/or the like. For example, the top surface of the insulating encapsulation 530 and the rear surfaces of the IC dies 510 are substantially level. Alternatively, the thinning process is omitted and the rear surfaces of the IC dies 510 are covered by the insulating encapsulation 530.

With continued reference to FIG. 25, the interposer 520 may include a semiconductor substrate 522, an interconnect structure 524 including metal lines and vias and formed on a side of the semiconductor substrate 522 facing the IC dies 510, conductive through-vias 526 penetrating through the semiconductor substrate 522 and connecting the interconnect structure 524, and conductive connectors 528 connected to the conductive through-vias 526 through conductive pads 527. Alternatively, the interconnect structure 524 is formed on a side of the semiconductor substrate 522 facing the first package component 1000, or may be formed on two opposing sides of the semiconductor substrate 522. The interposer 520 may optionally be free from active devices and/or passive devices.

The conductive connectors 528 of the interposer 520 may be electrically and physically coupled to conductive pattern 108A at the second side S2 of the circuit substrate 100A, and may include or may be solder balls, metal pillars, C4 bumps, micro-bumps, ENEPIG formed bumps, and/or the like. The respective conductive connector 528 may have the size greater than that of the die connector 512 of the IC die 510. The spacing between adjacent conductive connectors 528 may be greater than the spacing between adjacent die connectors 512. The conductive connectors 528 may be formed by plating, evaporation, printing, solder transfer, ball placement, and/or the like. A reflow process may be performed to the conductive connectors 528 in order to form conductive joints between the second package component 2000 and the first package component 1000.

In some embodiments, the interposer 520 and the insulating encapsulation 530 of the wafer are singulated by a singulation process to separate the structure into a plurality of the second package components 2000, where the outer sidewalls of the interposer 520 may have substantially the same width as the outer sidewalls of the insulating encapsulation 530. For example, the second package component 2000 after singulation may have edges 2000e formed by coterminous outer sidewalls of the interposer 520 and the insulating encapsulation 530. The application of heat during the reflow process may cause warpage in the second package component 2000. For example, the second package component 2000 warps with the edges 2000e curving downwardly, where the central region of the second package component 2000 is higher than the peripheral region of the second package component 2000. Alternatively, the second package components 2000 may have a concave warpage with the central region lower than the peripheral region, or may have complex warpages rather than simple convex/concave warpages.

With continued reference to FIG. 25, the first package component 1000, similar to the second package component 2000, may warp with the edges 1000e bent downwardly. The first package component 1000 may be similar to the resulting structure shown in FIG. 9 or FIG. 23. For example, the first package component 1000 includes the circuit substrate 100A, the patterned mask layer 110 formed on the first side S1 of the circuit substrate 100A, and the external terminals 120 formed in the openings of the patterned mask layer 110 to be connected to the circuit substrate 100A. The patterned mask layer 110 may be similar to the patterned mask layer 110A described in FIG. 9. Alternatively, the patterned mask layer 110 may be similar to the patterned mask layer 110B described in FIG. 23, and thus the detailed descriptions of the patterned mask layer 110 may not be repeated herein.

In some embodiments, a patterned mask layer 110' may be optionally formed on the second side S2 of the circuit substrate 100A, where the patterned mask layer 110' is illustrated in phantom to show it may (or may not) be present. The patterned mask layer 110' may include openings accessibly revealing at least a portion of the conductive pattern 108A for the conductive connectors 528 of the interposer 520 mounted thereon. The openings of the patterned mask layer 110' may be non-uniform in size, where the design rule of the opening size may be similar to that of the patterned mask layer 110A described in FIG. 5. Alternatively, the openings of the patterned mask layer 110' may be substantially uniform in size, where the design rule of the opening size may be similar to that of the patterned mask layer 110B described in FIG. 21.

The external terminals 120 (e.g., including 1201, 1202) formed on the patterned mask layer 110 and having varying heights may be similar to the external terminals 120A described in FIG. 9 or may be similar to the external terminals 120B described in FIG. 23. In some embodiments, the external terminals 120 are referred to as ball grid array (BGA) balls or solder balls. In some embodiments, the heights of the external terminals 120 are adjusted by varying the opening sizes of the patterned mask layer 110. For example, the external terminal 1201 formed in the opening 1101 at the central region of the circuit substrate 100A has a maximum height 1201H, and the external terminal 1202 formed in the opening 1102 at the corner region of the circuit substrate 100A has a maximum height 1202H. The lateral dimension OD1' of the opening 1101 may be substantially less than the lateral dimension OD2' of the opening 1102. Under this scenario, when mounting the conductive balls having uniform volume onto the circuit substrate 100A to form the external terminals 120, the external terminal 1201 located at the center may have the maximum height 1201H greater than the maximum height 1202H of the external terminal 1202 located at the corner. In some embodiments, the radius of curvature of the cross-sectional profile of the external terminal 1201 is less than the radius of curvature of the cross-sectional profile of the external terminal 1202. As mentioned above, by varying the sizes of the conductive balls during the ball placement process, the external terminals 120 with varying heights may be formed on the circuit substrate 100A in accordance with some embodiments.

In some embodiments, even if the external terminals 120 with the adjusted heights are formed, the major surfaces of the external terminals 120 may have non-coplanarity. For example, the first package component 1000 includes a difference F1 between a highest point and a lowest point of the external terminals 120. The difference F1 may be the shortest distance between a virtual plane where the end point 1201P of the external terminal 1201 is located on and a virtual plane where the end point 1202P of the external terminal 1202 is located on. Apparently, too large of the difference F1 will cause connection defects (e.g., cold-joints and/or bridging) when mounting the package structure 12A onto a circuit board (as shown in FIG. 27). For example, the difference F1 should be reduced to be less than the specified allowable non-coplanarity for mounting the package structure 12A onto the circuit board. It has been observed that by configuring the external terminals 120 with adjusted heights, the difference F1 is advantageously controlled and reductions in manufacturing defects due to the bonding may be achieved. For example, at room temperature (e.g., about 25° C.), the difference F1 of the package structure 12A is controlled to be less than 10 mil (e.g., about 254 μm). Although this value may vary depending on different product requirements. The less the difference F1 is, the more the reliability of the bonded structure is formed.

Referring to FIG. 26 and with continued reference to FIG. 25, the package structure 12B is similar to the package structure 12A shown in FIG. 25, except that the package structure 12B has a concave warpage with the edges (1000e and 2000e) curving upwardly. For example, when a heat source (not shown) is applied, the package structure 12A may be heated from a first temperature (e.g., room temperature or around 25° C.-50° C.) to a second temperature (e.g., a high temperature, or around 200° C.-250° C. or even greater), which may result in warpage to form the package structure 12B. The warpage characteristics of the package structure 12A may be altered during heating. In some embodiments, the package structure 12B warps in the opposing direction relative to the warpage of the package structure 12A. It is understood that the warpage level and characteristics may depend on the materials and elements in the package structure, and the above example is provided for illustrative purposes only.

In some embodiments, the application of heat not only alters of warpage characteristics of the package structure 12A but also changes the warpage amount of the package structure 12B. The warpage amount of the package structure 12B is greater as compared to the package structure 12A at the lower temperature. For example, the difference F1' of the package structure 12B is formed between a highest point (e.g., the end point 1202P of the external terminal 1202 at the corner) and a lowest point (e.g., the end point 1201P of the external terminal 1201 at the center) of the external terminals 120. In some embodiments, the difference F1' of the package structure 12B subjected to a high temperature is substantially greater than the difference F1 of the package structure 12A at room temperature. In some instances where the difference F1' is beyond the specified allowable non-coplanarity, issues (e.g., manufacturing defects) may arise in the subsequent processes, and thus improving the configuration of the external terminals on the circuit substrate to optimize reliability is required.

In some embodiments, a computing system (not shown) is adapted to determine the optimal heights of individual external terminals so as to meet requirements of coplanarity at various temperature conditions. For example, the computing system is configured to perform the steps of analyzing parameters (e.g., characteristics of materials in the package structure, stress distribution of each point in a three-dimensional space, etc.), estimating (and/or modeling) the warpage profile of the package structure at various temperature conditions, and other suitable step(s). The steps may be repeated in a closed loop process until the simulation results (and/or model) indicate that the desired reduction in non-coplanarity has been achieved. The computing system may be configured to determine the opening sizes of the patterned mask layer as described in FIG. 5, or may be used to determine a desired volume of various conductive balls as described in FIG. 22, based on the simulation results. The package structure is then fabricated based on the provided design generated by the computing system. Accordingly, the package structure includes the external terminals with the optimal heights, and the difference F1 at room temperature and the difference F1' at elevated temperature are less than the specified allowable non-coplanarity by configuring the optimal heights of individual external terminals.

Referring to FIG. 27 with continued reference to FIGS. 25-26, a semiconductor structure 10 including the package structure 12A mounted on a circuit board 14 is provided. The circuit board 14 may be or may include a printed circuit board (PCB), a mother board, a system board, and/or the like. For example, the external terminals 120 are disposed on the bond pads 142 of the circuit board 14 and are then subjected to a reflow process to form conductive joints 120A' to electrically couple the package structure 12A to the circuit board 14. In some embodiments, during the reflow process, the external terminals 120 of the package structure 12A may be heated from room temperature to a temperature of or greater than a melting point of the external terminals 120.

In some embodiments, the application of heat may cause the warpage of package structure 12A being altered to be the package structure 12B with the edges (1000e and 2000e) curving upwardly. It is understood that standoffs between the package structure 12A and the circuit board 14 may vary due to warpage. The warpage characteristics may be analyzed before bonding the package structure 12A to the circuit board 14 by the computing system. The standoffs between the package structure 12A and the circuit board 14 in different areas of the bonding surfaces may be estimated by analyzing the warpage profile. Thus, the external terminals having the optimal heights that are used to bond the package structure 12A to the circuit board 14 may be configured in accordance with the estimated standoffs. By controlling the heights of the external terminals 120, variation of standoffs between the package structure 12A and the circuit board 14 may be minimized.

In some embodiments, the mechanisms for reducing variation of standoffs are applied to the manufacture of the openings of the patterned mask layer with estimated sizes on different regions within the circuit substrate 100A. In other embodiments, the mechanisms for reducing variation of standoffs are applied to the manufacture of the placement of the conductive balls with estimated sizes on different regions within the circuit substrate 100A before the reflow process. Each of the external terminals 120 having the optimal heights may remain in contact with the one of the bond pads 142 of the circuit board 14 during the reflow process, and when cooled, the external terminals 120 are bonded to the bond pads 142 to form the conductive joints 120A' connecting the circuit substrate 100A to the circuit board 14. The external terminals with the optimal/varying heights may offer higher reliability and improved electrical performance.

Figure 28:
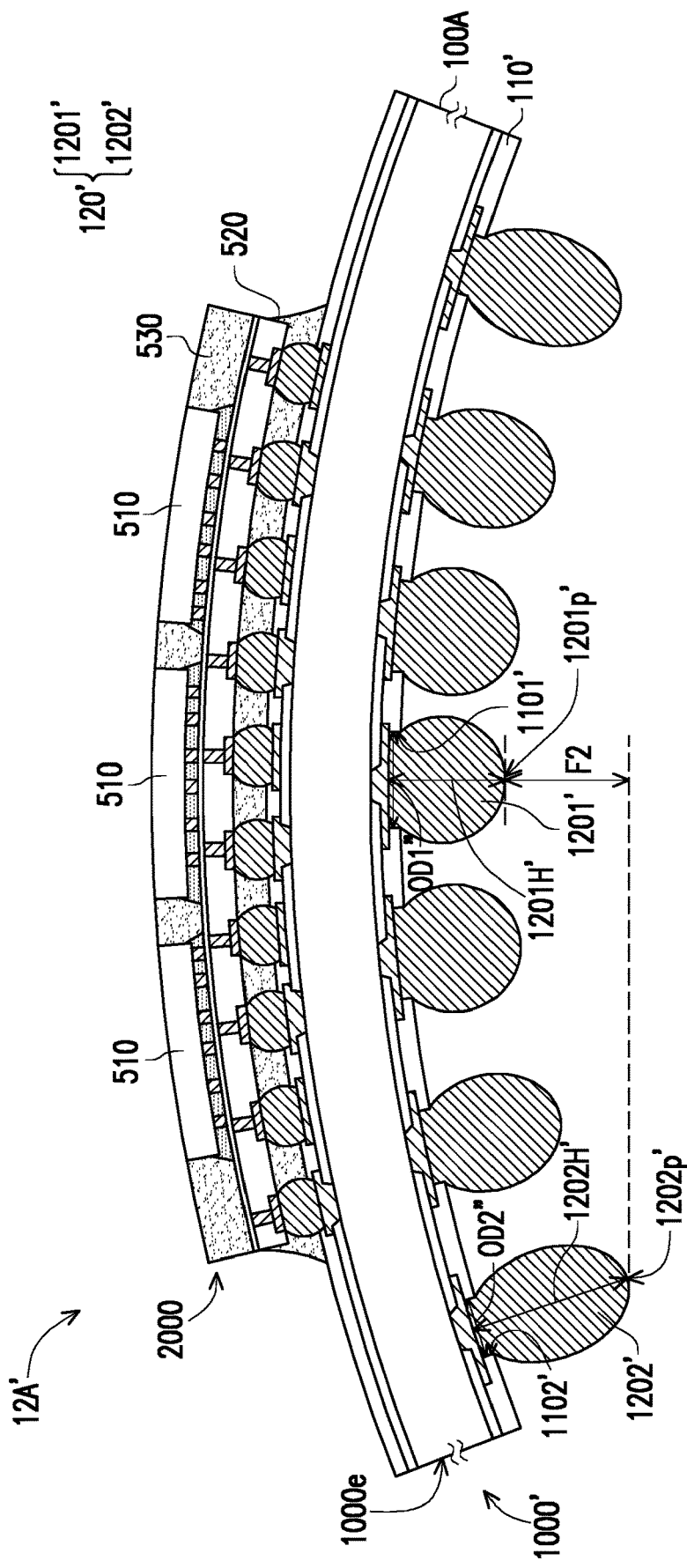
FIGS. 28-29 are schematic cross-sectional views showing a package structure before and after heating in accordance with some embodiments.
Figure 29:
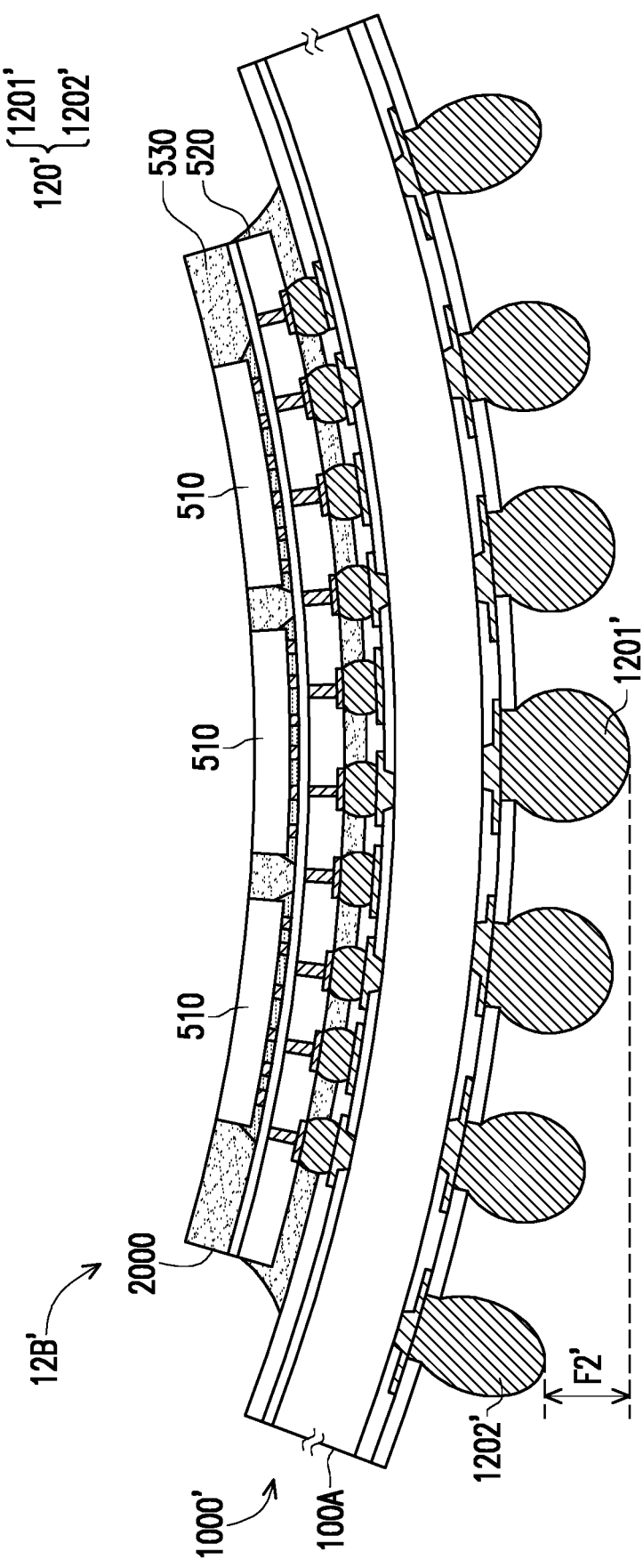

FIGS. 28-29 are schematic cross-sectional views showing a package structure before and after heating in accordance with some embodiments and FIG. 30 is a schematic cross-sectional view of a semiconductor structure including a package structure mounted on a circuit board in accordance with some embodiments. Throughout the various views and illustrative embodiments, like reference numbers are used to designate like elements. It should be noted that the circuit substrate 100A herein is illustrated in a simplified manner and may be similar to the circuit substrate 100A described in FIG. 1.

Referring to FIG. 28, a package structure 12A' including the first package component 1000' and the second package component 2000 mounted thereon may be similar to the package structure 12A shown in FIG. 25, and thus the detailed descriptions are not repeated for the sake of brevity. The difference between the package structures 12A and 12A' includes that the maximum height 1201H' of the external terminal 1201' located at the central region of the package structure 12A' may be less than the maximum height 1202H' of the external terminal 1202' located at the corner region of the package structure 12A'. For example, the patterned mask layer 110' includes the openings with varying sizes, where the opening 1101' located at the central region and corresponding to the external terminal 1201' may have the lateral dimension OD1" greater than the lateral dimension OD2" of the opening 1102' located at the corner region and corresponding to the externa terminal 1202'. Alternatively, the external terminals 120' with varying heights are formed by means of the processes described in FIGS. 21-23.

In some embodiments, the package structure 12A' has a convex warpage at the first temperature (e.g., room temperature around 25° C. or about 25° C. to about 50° C.). Due to the warpage, a difference F2 of the package structure 12A' may form between a highest point (e.g., the end point 1201p' of the external terminal 1201' at the center) and a lowest point (e.g., the end point 1202p' of the external terminal 1202' at the corner) of the external terminals 120'. The difference F2 may be the shortest distance between a virtual plane where the end point 1201p' of the external terminal 1201' is located on and a virtual plane where the end point 1202p' of the external terminal 1202' is located on. As mentioned above, the difference F2 may be reduced to be less than the specified allowable non-coplanarity by configuring the external terminals 120' with adjusted heights so as to achieve reductions in manufacturing defects and better reliability.

Referring to FIG. 29 and with continued reference to FIG. 28, in some embodiments, the package structure 12B' is heated from the first temperature (e.g., room temperature or around 25° C.-50° C.) to a second temperature (e.g., a high temperature, or around 200° C.-250° C. or even greater), which may result in warpage to form the package structure 12B'. As shown in FIG. 29, the package structure 12B' may have a concave warpage with the edges (1000e and 2000e) curving upwardly. It is understood that the above example is provided for illustrative purposes only, and the warpage level and characteristics may depend on the materials and elements in the package structure.

In some embodiments, the difference F2 of the package structure 12A' shown in FIG. 28 is different from the difference F2' of the package structure 12B', where the difference F2' of the package structure 12B' is a shortest distance measured between a virtual plane where the end point 1201p' of the external terminal 1201' is located on and a virtual plane where the end point 1202p' of the external terminal 1202' is located on. In some embodiments, the difference F2 of the package structure 12A' at room temperature is substantially greater than the difference F2' of the package structure 12B' at the elevated temperature. In other words, the non-coplanarity of the package structure 12B' at the elevated temperature is less than that of the package structure 12A' at room temperature. In some instances where the difference F2 is beyond the specified allowable non-coplanarity, issues (e.g., manufacturing defects) may arise in the subsequent processes. For example, the difference F2 of the package structure 12A' should be controlled to be less than 100 µm at the temperature greater than 245° C. Although this value may vary depending on different product requirements. In some embodiments, to reduce/eliminate non-coplanarity issues on the package structure 12A', the heights of the external terminals formed over the circuit substrate may be optimized to meet requirements of coplanarity at various temperature conditions.

As described above, the computing system may be configured to perform the warpage profile analysis and estimation of the desired opening sizes of the patterned mask layer (and/or estimation of the desired sizes of conductive balls). The package structure is then fabricated based on the provided design generated by the computing system. Accordingly, the package structure includes the external terminals with the optimal heights, and the difference F2 at room temperature and the difference F2' at elevated temperature are less than the specified allowable non-coplanarity by configuring the optimal heights of individual external terminals.

Referring to FIG. 30 with continued reference to FIGS. 28-29, a semiconductor structure 20 including the package structure 12A' mounted on the circuit board 14 is provided. For example, the external terminals 120' are disposed on the bond pads 142 of the circuit board 14 and are then subjected to the reflow process to form conductive joints 120B' which electrically couple the package structure 12A' to the circuit board 14. During the reflow process, the external terminals 120' of the package structure 12A' may be heated, and the warpage of package structure 12A' may be changed to be the package structure 12B' with the edges (1000e and 2000e) curving upwardly. Each of the external terminals 120' having the optimal heights may remain in contact with the one of the bond pads 142 of the circuit board 14 during the reflow process. When cooled, the external terminals 120' may be bonded to the bond pads 142 to form the conductive joints 120B' connecting the circuit substrate 100A to the circuit board 14. Thus, the external terminals with the optimal/varying heights may offer higher reliability and improved electrical performance.

Figure 31:
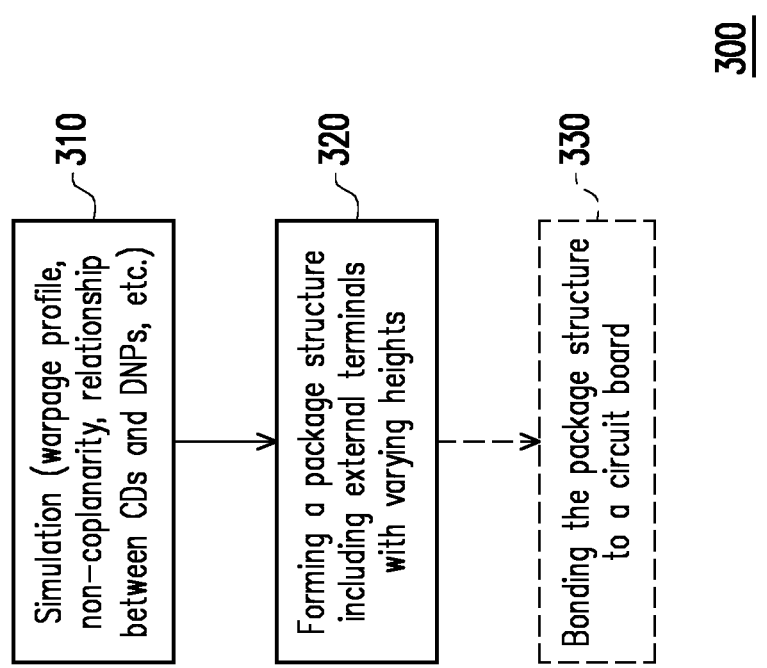
FIG. 31 is a flowchart of a manufacturing method of a semiconductor structure in accordance with some embodiments.

FIG. 31 is a flowchart of a manufacturing method of a semiconductor structure in accordance with some embodiments. While a manufacturing method 300 is illustrated and described below, it is appreciated that these steps are not limiting in that the order of the steps can be altered in other embodiments, and the methods disclosed are also applicable to other structures. In other embodiments, some steps that are illustrated and/or described may be omitted in whole or in part, and additional steps may be provided before, during, and after steps. The elements describe below are the same/similar to those elements as described elsewhere herein, and those elements may only be briefly described below.

Referring to FIG. 31, the manufacturing method 300 includes at least the following steps. At step 310, a simulation may be performed. For example, the warpage characteristics of the package structure to be fabricated are analyzed to generate the warpage profile of the package structure. In some embodiments, Moiré measurements are taken in order to analyze and predict the warpage profile of the package structure. Although any suitable method (e.g., empirical data) may be used. Based on the warpage profile of the package structure, the non-coplanarity of the package structure at various temperature conditions may be estimated. If the non-coplanarity of the package structure at certain temperature is beyond the specified allowable non-coplanarity, the opening configuration of the patterned mask layer (and/or the sizes of the conductive balls to be placed) may be modified until the simulation results (and/or model) indicate that the desired reduction in non-coplanarity has been achieved.

In some embodiments, a relationship between the critical dimensions (CD) (e.g., the lateral dimensions of the opening sizes or critical dimensions (CD) of the external terminals) and the distance to neutral points (DNP) is established. For example, the relationship is established based on the simulation results, experimental data, etc. In some embodiment, stress/strain levels at each location of the external terminals to be formed are estimated. It is understood that the external terminals on different locations with varying DNPs have different stress levels. For example, if the external terminal corresponding to the greatest DNP is able to withstand a highest stress level, and thus cracks may be avoided. Under such scenario, the fabrication of the package structure may be performed based on the established relationship. Otherwise, if the external terminal is unable to withstand a high stress level, the opening configuration of the patterned mask layer (and/or the sizes of the conductive balls to be placed) may be modified to establish a new relationship between (CD) and (DNP) until all of the predetermined external terminals are able to withstand corresponding stress levels.

At step 320, based on the simulation results described above, the package structure may be formed. The forming method may be similar to the method described in FIGS. 2-9 or FIGS. 21-23. At step 330, the package structure may be bonded to the circuit board to form the semiconductor structure as shown in FIG. 27 or FIG. 30. Since the bonding process is optional, the step 330 is illustrated in phantom to show it may (or may not) be present. It is understood that additional semiconductor processes may be performed to the package structure depending on product requirements.

According to some embodiments, a manufacturing method of a semiconductor structure includes at least the following steps. A plurality of conductive balls is placed over a circuit substrate, where each of the plurality of conductive balls is placed over a contact area of one of a plurality of contact pads that is accessibly revealed by a patterned mask layer. The plurality of conductive balls is reflowed to form a plurality of external terminals with varying heights connected to the plurality of contact pads of the circuit substrate, where a first external terminal of the plurality of external terminals formed in a first region of the circuit substrate and a second external terminal of the plurality of external terminals formed in a second region of the circuit substrate are non-coplanar.

According to some alternative embodiments, a manufacturing method of a semiconductor structure includes at least the following steps. A relationship between critical dimensions of a plurality of external terminals subsequently formed on a patterned mask layer over a circuit substrate and distance to neutral points is obtained, where the distance to neutral points are distances of the plurality of external terminals to a center of the circuit substrate. The patterned mask layer with a plurality of openings is formed on the circuit substrate based on the relationship. A ball placement process is performed to place a plurality of conductive balls on the patterned mask layer, where each of the conductive balls is placed in one of the plurality of openings. A reflow process is performed to the conductive balls to form the plurality of external terminals coupled to the circuit substrate, where the plurality of external terminals is non-uniform in height.

According to some alternative embodiments, a semiconductor structure including a circuit substrate, a solder resist layer, and a plurality of external terminals is provided. The circuit substrate includes a plurality of contact pads, the solder resist layer is disposed on the circuit substrate and partially covering the plurality of contact pads, and the external terminals are disposed on the solder resist layer and extending through the solder resist layer to be in contact with the plurality of contact pads. A first maximum height of a first external terminal of the plurality of external terminals is greater than a second maximum height of a second external terminal of the plurality of external terminals, and a first interface between the first external terminal and corresponding one of the plurality of contact pads underlying the first external terminal is greater than a second interface between the second external terminal and another corresponding one of the plurality of contact pads underlying the second external terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor structure, comprising:
    forming a patterned mask layer on a circuit substrate, wherein the patterned mask layer comprises a plurality of openings that are substantially uniform in size;
    placing a plurality of conductive balls over the circuit substrate, wherein the plurality of conductive balls comprise varying volume, each of the plurality of conductive balls is placed in one of the plurality of openings of the patterned mask layer and disposed over a contact area of one of a plurality of contact pads that is accessibly revealed by the patterned mask layer;
    reflowing the plurality of conductive balls to form a plurality of external terminals with varying heights connected to the plurality of contact pads of the circuit substrate, wherein a first external terminal of the plurality of external terminals formed in a first region of the circuit substrate and a second external terminal of the plurality of external terminals formed in a second region of the circuit substrate are non-coplanar; and
    establishing an equation that expresses a relationship between critical dimensions of the plurality of external terminals and distance to neutral points, before placing the plurality of conductive balls, wherein the distance to neutral points are distances of the plurality of external terminals to a center of the circuit substrate.

2. The manufacturing method of claim 1, further comprising:
    providing pins of a dipping apparatus coated with a flux material; and transferring the flux material onto the circuit substrate after forming the patterned mask layer and before placing the plurality of conductive balls over the circuit substrate.

3. The manufacturing method of claim 2, wherein placing the plurality of conductive balls comprises:
performing a ball placement process to place the plurality of conductive balls on the flux material.

4. The manufacturing method of claim 1, further comprising:
forming a pre-solder material on the contact area of each of the plurality of contact pads.

5. The manufacturing method of claim 1, further comprising:
disposing the plurality of external terminals on a circuit board; and
reflowing the plurality of external terminals to couple the circuit substrate to the circuit board through the plurality of external terminals, wherein each of the plurality of external terminals remains in contact with corresponding one of a plurality of bond pads of the circuit board while an operating temperature changes from a first temperature to a second temperature.

6. The manufacturing method of claim 1, wherein a first non-coplanarity between the first external terminal and the second external terminal at a room temperature is less than a second non-coplanarity between the first external terminal and the second external terminal at a heating operation temperature, and forming the plurality of external terminals comprises:
forming the first external terminal with a first maximum height at a corner of the circuit substrate and the second external terminal with a second maximum height at a center of the circuit substrate, wherein the first maximum height is less than the second maximum height.

7. The manufacturing method of claim 1, wherein a first non-coplanarity between the first external terminal and the second external terminal at a room temperature is greater than a second non-coplanarity between the first external terminal and the second external terminal at a temperature higher than the room temperature, and forming the plurality of external terminals comprises:
forming the first external terminal with a first maximum height at a corner of the circuit substrate and the second external terminal with a second maximum height at a center of the circuit substrate, wherein the first maximum height is greater than the second maximum height.

8. The manufacturing method of claim 1, wherein forming the patterned mask layer with the plurality of openings on the circuit substrate based on the relationship.

9. The manufacturing method of claim 1, further comprising:
printing a flux material within the plurality of openings of the patterned mask layer using a stencil before placing the plurality of conductive balls over the circuit substrate.

10. A manufacturing method of a semiconductor structure, comprising:
obtaining a relationship between critical dimensions of a plurality of external terminals subsequently formed on a patterned mask layer over a circuit substrate and distance to neutral points, wherein the distance to neutral points are distances of the plurality of external terminals to a center of the circuit substrate;
forming the patterned mask layer with a plurality of openings on the circuit substrate based on the relationship;
performing a ball placement process to place a plurality of conductive balls on the patterned mask layer, wherein each of the conductive balls is placed in one of the plurality of openings; and
performing a reflow process to the conductive balls to form the plurality of external terminals coupled to the circuit substrate, wherein the plurality of external terminals is non-uniform in height.

11. The manufacturing method of claim 10, further comprising:
forming a pre-solder material on a portion of each of a plurality of contact pads of the circuit substrate that is accessibly revealed by one of the plurality of openings of the patterned mask layer, before performing the ball placement process; and
forming a flux material on the pre-solder material within the plurality of openings of the patterned mask layer, wherein when performing the ball placement process, the plurality of conductive balls are attached onto the flux material.

12. The manufacturing method of claim 10, wherein forming the patterned mask layer comprises:
forming a mask layer to cover a plurality of contact pads of the circuit substrate; and
removing portions of the mask layer to form the plurality of openings with non-uniform in size to accessibly reveal the plurality of contact pads with different contact areas.

13. The manufacturing method of claim 10, wherein:
forming the patterned mask layer comprising forming a first opening with a first lateral dimension and a second opening with a second lateral dimension less than the first lateral dimension; and
performing the ball placement process comprising providing the plurality of conductive balls substantially uniform in volume, wherein after the reflow process, a first external terminal of the plurality of external terminals formed in the first opening has a first maximum height less than a second maximum height of a second external terminal of the plurality of external terminals formed in the second opening.

14. The manufacturing method of claim 10, wherein forming the plurality of external terminals comprises:
forming a first external terminal with a first maximum height and a first radius of curvature in a central region of the circuit substrate;
forming a second external terminal with a second maximum height and a second radius of curvature in a peripheral region of the circuit substrate, wherein the first maximum height is greater than the second maximum height, the first radius of curvature is less than the second radius of curvature.

15. The manufacturing method of claim 10, wherein forming the plurality of external terminals comprises:
forming a first external terminal with a first maximum height and a first radius of curvature in a central region of the circuit substrate;
forming a second external terminal with a second maximum height and a second radius of curvature in a peripheral region of the circuit substrate, wherein the first maximum height is less than the second maximum height, the first radius of curvature is greater than the second radius of curvature.

16. The manufacturing method of claim 10, further comprising:
- disposing the plurality of external terminals on a circuit board; and
- reflowing the plurality of external terminals to couple the circuit substrate to the circuit board through the plurality of external terminals, wherein each of the plurality of external terminals remains in contact with corresponding one of a plurality of bond pads of the circuit board while an operation temperature changes from a first temperature to a second temperature.

17. A manufacturing method of a semiconductor structure, comprising:
- forming external terminals with varying heights on contact pads of a circuit substrate in a one-to-one correspondence by using a patterned mask layer with varying opening sizes, wherein a first external terminal of the external terminals formed in a first opening size of the patterned mask layer is higher than a second external terminal of the external terminals formed in a second opening size of the patterned mask layer, and the first opening size is less than the second opening size, wherein forming the external terminals with varying heights on the contact pads of the circuit substrate comprises:
  - forming the patterned mask layer with varying opening sizes on the circuit substrate, wherein the varying opening sizes comprises the first opening size and the second opening size;
  - forming a pre-solder material on portions of the contact pads of the circuit substrate that are exposed by the patterned mask layer;
  - forming a flux material on the pre-solder material;
  - placing conductive balls on the flux material; and
  - reflowing the conductive balls.

18. The manufacturing method of claim 17, further comprising:
- performing a simulation to determine the varying opening sizes of the patterned mask layer before forming the external terminals, wherein the simulation comprises warpage characteristics of the circuit substrate; and
- establishing an equation that expresses a relationship between critical dimensions of the varying opening sizes of the patterned mask layer and distance to neutral points on the circuit substrate.

19. The manufacturing method of claim 17, wherein forming the patterned mask layer with the varying opening sizes on the circuit substrate comprises performing an exposure process and a developing process on a mask material layer.

20. The manufacturing method of claim 17, wherein forming the flux material on the pre-solder material comprises:
- providing pins of a dipping apparatus coated with the flux material; and
- transferring the flux material onto the circuit substrate.

* * * * *